US007711127B2

(12) United States Patent
Suzuki et al.

(10) Patent No.: US 7,711,127 B2

(45) Date of Patent: May 4, 2010

(54) APPARATUS, METHOD AND PROGRAM FOR PROCESSING ACOUSTIC SIGNAL, AND RECORDING MEDIUM IN WHICH ACOUSTIC SIGNAL, PROCESSING PROGRAM IS RECORDED

(75) Inventors: Kaoru Suzuki, Yokohama (JP); Toshiyuki Koga, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1252 days.

(21) Appl. No.: 11/235,244

(22) Filed: Sep. 27, 2005

(65) Prior Publication Data

US 2006/0215854 A1 Sep. 28, 2006

(30) Foreign Application Priority Data

Mar. 23, 2005 (JP) ............................ 2005-084443

(51) Int. Cl.
*H04R 3/00* (2006.01)
*H04R 1/40* (2006.01)
*H03G 5/00* (2006.01)

(52) U.S. Cl. ........................ 381/92; 381/122; 381/113; 381/98; 381/97

(58) Field of Classification Search .................. 381/97, 381/98, 94.3, 56, 58, 92, 122, 111, 112, 113, 381/114, 303

See application file for complete search history.

(56) References Cited

FOREIGN PATENT DOCUMENTS

JP 2003-337164 11/2003

OTHER PUBLICATIONS

Shimoyama et al "Multiple acoustic source localization using ambiguous phase differences under reverberative conditions" Jun. 18, 2004.*

(Continued)

*Primary Examiner*—Xu Mei
*Assistant Examiner*—George C Monikang
(74) *Attorney, Agent, or Firm*—Oblon, Spivak, McClelland, Maier & Neustadt, L.L.P.

(57) ABSTRACT

An acoustic signal processing apparatus includes an acoustic signal input device, a frequency resolution device, a two-dimensional data generating device, a graphics detection device, a sound source candidate information generating device, and a sound source information generating device. The sound source information generating device generates sound source information including at least one of the number of sound sources, the spatial existence range of the sound source, an existence period of the voice, a frequency component configuration of the voice, amplitude information on the voice, and symbolic contents of the voice based on the sound source candidate information and corresponding information which are generated by the sound source candidate information generating device.

6 Claims, 26 Drawing Sheets

OTHER PUBLICATIONS

Takehiro Ihara, et al., "Multi-Channel Speech Separation and Localization by Frequency Assignment", The Institute of Electronics Information and Communication Engineers, vol. J86-A, No. 10, Oct. 1, 2003, 3 cover pages, pp. 998-1009.

Kaoru Suzuki, et al., "Realization of Home Robot's "Within Call" Function by Audiovisual Cooperation" Japanese Proceedings of SICE, System Integration Division Annual Conference, 2F4-5, 2003, pp. 576-577 (with English Abstract).

Akio Okazaki, "3.3.9 Hough Transformation (Line Detection)", Japanese Standard Handbook "Hajimete-No Gazo Syori Gijutsu", 2000, pp. 100-102.

Tadashi Amada, et al., "Microphone Array Technique for Speech Recognition", Japanese Journal, Toshiba Review, vol. 59, No. 9, 2004, pp. 42-44.

Akio Okazaki, "3.3.6 Thinning", Japanese Standard Handbook, "Hajimete-No Gazo Syori Gijutsu", 2000, pp. 88-93.

Futoshi Asano, "Separation of Sound" Japanese Journal of the Society of Instrument and Control Engineers, vol. 43, No. 4, 2004, pp. 325-330.

Kazuhiro Nakadai, et al., "Real-Time Active Tracking by Hierarchical Integration of Audition and Vision", JSAI Technical Report, SIG-Challenge-0317-6, 2001, pp. 35-42 (with English Abstract).

* cited by examiner

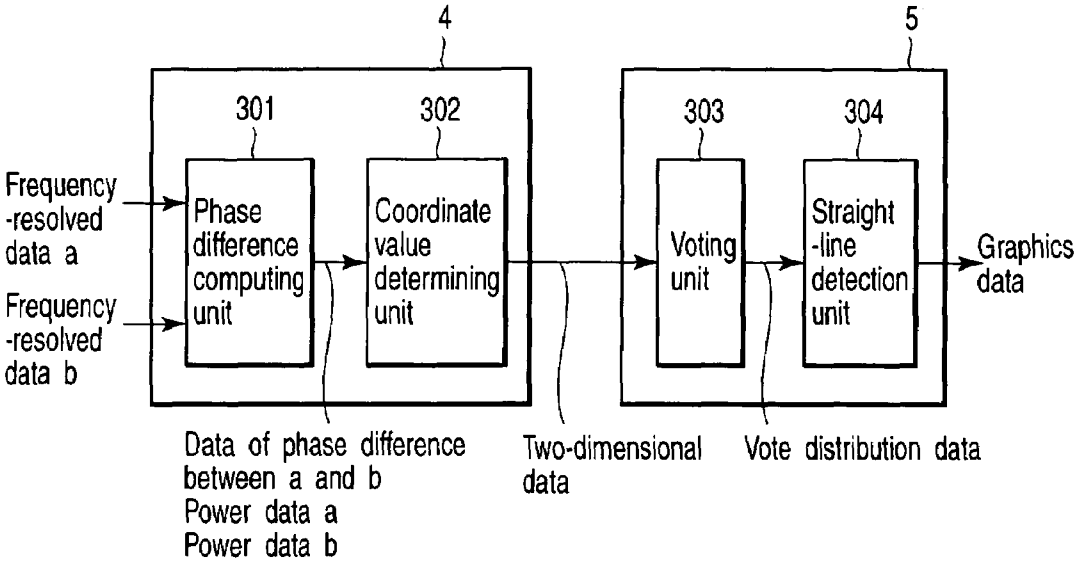

F I G. 5

```
Phase difference
    ΔPh(fk)=Ph2(fk)-Ph1(fk);
    while(1){
        if(ΔPh(fk)≦-π){ΔPh(fk)=ΔPf(fk)+2π;continue;}
        break;
    }
    while(1){
        if(ΔPh(fk)>π){ΔPh(fk)=ΔPf(fk)-2π;continue;}
        break;
    }
    Where,
      Ph1(fk) is a phase value in a frequency component fk of a microphone 1a,
      Ph2(fk) is a phase value in a frequency component fk of a microphone 1b,
      and a value of ΔPh(fk) is in a range of -π < ΔPh(fk) <= π.
```

F I G. 6

```
Coordinate difference
    x(fk)=ΔPh(fk)
    y(fk)=k
```

F I G. 7

Power function $G(P(fk))=V+1 \quad : V>0$ $G(P(fk))=1 \quad : V>0$

Provided that, $V=\log_{10}(P(fk))+\alpha$ $P(fk)=(Po2(fk)+Po1(fk))/2$

APPARATUS, METHOD AND PROGRAM FOR PROCESSING ACOUSTIC SIGNAL, AND RECORDING MEDIUM IN WHICH ACOUSTIC SIGNAL, PROCESSING PROGRAM IS RECORDED

CROSS-REFERENCE TO RELATED APPLICATIONS

This application is based upon and claims the benefit of priority from prior Japanese Patent Application No. 2005-084443, filed Mar. 23, 2005, the entire contents of which are incorporated herein by reference.

BACKGROUND OF THE INVENTION

1. Field of the Invention

The present invention relates to acoustic signal processing, particularly to estimation of the number of sound sources propagating through a medium, a direction of the acoustic source, frequency components of acoustic waves coming from the sound sources, and the like.

2. Description of the Related Art Recently, a sound source localization and separation system is proposed in a field of robot auditory research. In the system, the number of plural target sound sources and the directions of the target sound sources are estimated under a noise environment (sound source localization), and each of the source sounds are separated and extracted (sound source separation). For example, F. Asano, "dividing sounds" Instrument and Control vol. 43, No. 4, p 325-330 (2004) discloses a method, in which N source sounds are observed by M microphones in an environment in which background noise exists, a spatial correlation matrix is generated from data in which short-time Fourier transform (FFT) process of each microphone output is performed, and a main eigenvalue having a larger value is determined by eigenvalue decomposition, thereby estimating a number N of sound sources as the main eigenvalue. In this case, characteristics in which the signal having no directional property such as the source sound having a directional property is mapped to the main eigenvalue while the background noise is mapped to all the eigenvalues are utilized.

Namely, an eigenvector corresponding to the main eigenvalue becomes a basis vector of a signal part space developed by the signal from the sound source, and the eigenvector corresponding to the remaining eigenvalue becomes the basis vector of the noise part space developed by the background noise signal. A position vector of each sound source can be searched for by utilizing the basis vector of the noise part space to apply a MUSIC method, and the sound from the sound source can be extracted by a beam former in which directivity is given to a direction obtained as a result of the search.

However, the noise part space cannot be defined when the number N of sound sources is equal to the number M of microphones, and the undetectable sound source exists when the number N of sound sources exceeds the number M of microphones. Therefore, the number of estimable sound sources is lower than the number M of microphones. In this method, there is no particularly large limitation with respect to the sound source, and it is a mathematically simple. However, in order to deal with many sound sources, there is a limitation that the number of microphones needed is higher than the number of sound sources.

A method in which the sound source localization and the sound source separation are performed using a pair of microphones is described in K. Nakadai et al., "real time active chase of person by hierarchy integration of audio-visual information" Japan Society for Artificial Intelligence AI Challenge Kenkyuukai, SIG-Challenge-0113-5, p 35-42, June 2001. In this method, by focusing attention on a harmonic structure (frequency structure including a fundamental wave and its harmonics) unique to the sound generated through a tube (articulator) like human voice, the harmonic structure having a different frequency of the fundamental wave is detected from data in which the Fourier transform of a sound signal obtained by the microphone is performed. The number of detected harmonic structures is set at the number of speakers, the direction with a certainty factor is estimated using interaural phase difference (IPD) and interaural intensity difference (IID) in each harmonic structure, and each source sound is estimated by the harmonic structure itself. In this method, the number of sound sources which is not lower than the number of microphones can be dealt with by detecting the plural harmonic structures from the Fourier transform. However, since the estimation of the number of sound sources, the direction, and the sound source is performed based on the harmonic structure, the sound source which can be dealt with is limited to the sounds such as the human voice having the harmonic structure, and the method cannot be adapted to the various sounds.

Thus, in the conventional methods, there is a problem of an antinomy that (1) the number of sound sources cannot be set at the number not lower than the number of microphones when no limitation is provided in the sound source, and (2) there is limitation such as assumption of the harmonic structure in the sound source when the number of sound sources is set at the number not lower than the number of microphones. Currently, the system of being able to deal with the number of sound sources not lower than the number of microphones without limiting the sound source is not established yet.

BRIEF SUMMARY OF THE INVENTION

In view of the foregoing, an object of the invention is to provide an acoustic signal processing apparatus, an acoustic signal processing method, and an acoustic signal processing program for the sound source localization and the sound source separation, in which the limitation of the sound source can further be released and the number of sound sources which is not lower than the number of microphones can be dealt with, and a computer-readable recording medium in which the acoustic signal processing program is recorded.

According to one aspect of the present invention, there is provided an acoustic signal processing apparatus comprising: an acoustic signal input device configured to input n acoustic signals including voice from a sound source, the n acoustic signals being detected at n different points (n is a natural number 3 or more); a frequency resolution device configured to resolve each of the acoustic signals into a plurality of frequency components to obtain n pieces of frequency resolved information including phase information of each frequency component; a two-dimensional data generating device configured to compute phase difference between a pair of pieces of frequency resolved information in each frequency component with respect to m pairs of pieces of frequency resolved information different from each other in the n pieces of frequency resolved information (m is a natural number 2 or more), the two-dimensional data generating device generating m pieces of two-dimensional data in which a frequency function is set at a first axis and a function of the phase difference is set at a second axis; a graphics detection device configured to detect predetermined graphics from each piece of the two-dimensional data; a sound source candidate information generating device configured to generate sound source candidate information including at least one of the number of a plurality of sound source candidates, a spatial existence range of each sound source candidate, and the frequency component of the acoustic signal from each sound source candidate based on each of the detected graphics, the sound source candidate information generating device generating corresponding information indicating a corresponding relationship between the pieces of sound source candidate information; and a sound source information generating device configured to generate sound source information including at least one of the number of sound sources, the spatial existence range of the sound source, an existence period of the voice, a frequency component configuration of the voice, amplitude information on the voice, and symbolic contents of the voice based on the sound source candidate information and corresponding information which are generated by the sound source candidate information generating device.

BRIEF DESCRIPTION OF THE SEVERAL VIEWS OF THE DRAWING

FIG. 5 is a functional block diagram showing each internal configuration of a two-dimensional data generating unit and a graphics detection unit;

FIG. 6 is a view showing a procedure of computing phase difference;

FIG. 7 is a view showing a procedure of computing a coordinate value;

DETAILED DESCRIPTION OF THE INVENTION

Embodiments of the invention will be described below with reference to the accompanying drawings.

Figure 1:
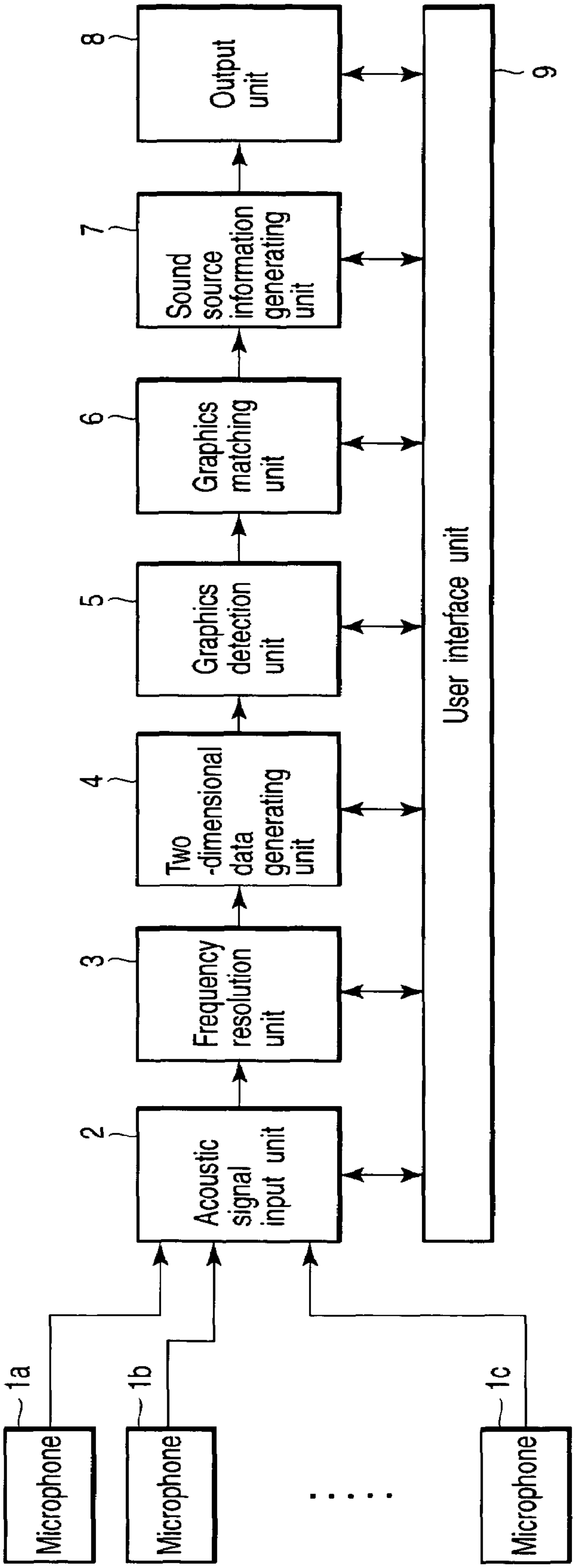
FIG. 1 is a functional block diagram showing an acoustic signal processing apparatus according to an embodiment of the invention.

As shown in FIG. 1, an acoustic signal processing apparatus according to an embodiment of the invention includes n numbers of (n is a natural number 2 or more) microphones 1*a* to 1*c*, an acoustic signal input unit 2, a frequency resolution unit 3, a two-dimensional data generating unit 4, a graphics detection unit 5, a graphics verification unit 6, an sound source information generating unit 7, an output unit 8, and a user interface unit 9.

[Basic Concept of Sound Source Estimation Based on Phase Difference in Each Frequency Component]

The microphones 1*a* to 1*c* are arranged at predetermined intervals in a medium such as air. The microphones 1*a* to 1*c* convert medium vibrations (acoustic waves) at different n points into electric signals (acoustic signals). The microphones 1*a* to 1*c* form different m pairs of microphones (m is a natural number larger than 1).

The acoustic signal input unit 2 periodically performs analog-to-digital conversion of the n-channel acoustic signals obtained by the microphones 1*a* to 1*c* at predetermined sampling period Er, which generates n-channel digitized amplitude data in time series.

Figure 2A:
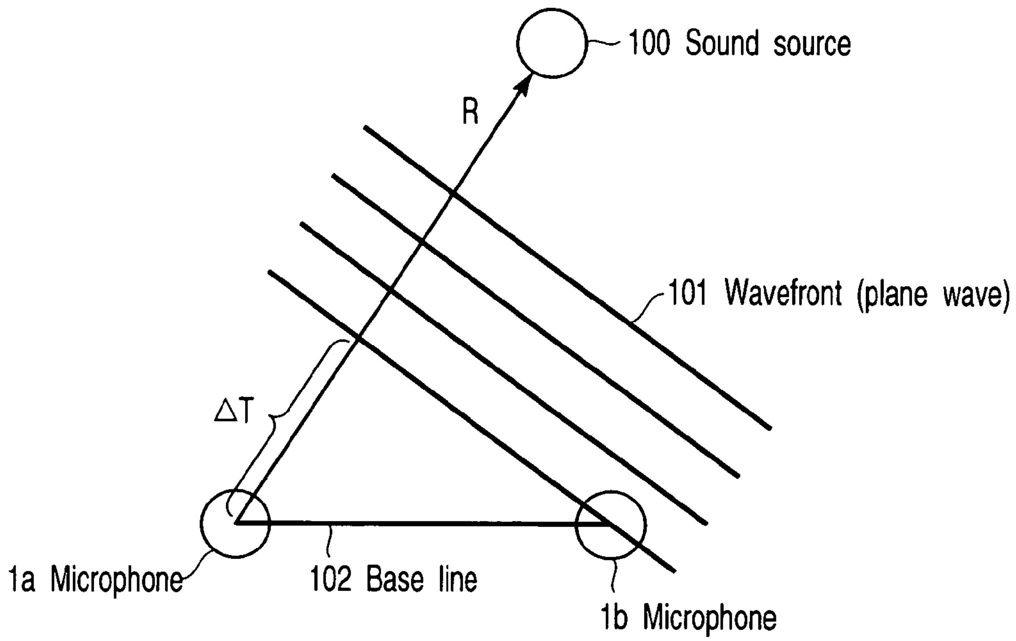
FIGS. 2A and 2B are views each showing an arrival time difference observed in a sound source direction and a sound source signal.

Assuming that the sound source is located sufficiently far away compared with a distance between the microphones, as shown in FIG. 2A, a wavefront 101 of the acoustic wave which reaches the pair of microphones from a sound source 100 becomes substantially a plane. For example, when the plane wave is observed at two different points using the microphone 1*a* and the microphone 1*b*, a given arrival time difference ΔT should be observed in the acoustic signals which are converted by the microphones according to a direction R of the sound source 100 with respect to a line segment 102 (referred to as base line) connecting the microphones. Assuming that the sound source is located sufficiently far away, the arrival time difference ΔT becomes zero when the sound source 100 exists on the plane perpendicular to the base line 102. The direction in which the plane is perpendicular to the base line 102 should be defined as a front face direction of the pair of microphones.

Figure 2B:
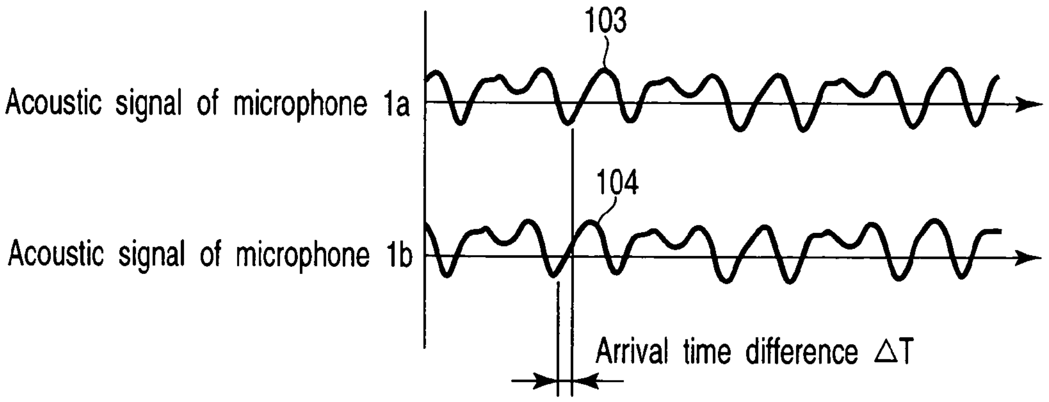

K. Suzuki et al., implementation of "coming by an oral command" function of home robots by audio-visual association Proceedings of Fourth Conference of the Society of Instrument and Control Engineers System Integration Division (SI2003), 2F4-5 (2003) discloses a method in which a resemblance of which part of one piece of amplitude data to which part of the other piece of amplitude data is searched by pattern matching to derive the arrival time difference ΔT between two acoustic signals (103 and 104 of FIG. 2B). Although the method is effective when only one strong sound source exists, the similarity part does not emerge clearly on the waveform in which the strong sounds from the plural directions are mixed with one another, when the strong background noise or the plural sound sources exist. Therefore, sometimes the pattern matching fails.

In the embodiment, the inputted amplitude data is analyzed by resolving the amplitude data in the phase difference of each frequency component. Accordingly, even if the plural sound sources exist, because the phase difference corresponding to the sound source direction is observed between two pieces of data with respect to the frequency component unique to each sound source, when the phase difference of each frequency component can be classified in a group of the same sound source direction without assuming the strong limitation for the sound source, the number of sound sources, the direction of each sound source, the main characteristic frequency component generated by each sound source should be grasped for wide-ranging sound sources. Although it is a straight forward idea, there are problems which need to be overcome when the actual data is analyzed. The functional blocks (the frequency resolution unit 3, the two-dimensional data generating unit 4, and the graphics detection unit 5) for grouping will continuously be described along with the problems.

[Frequency Resolution Unit 3]

Fast Fourier transform (FFT) can be cited as a general technique of resolving the amplitude data into the frequency components. A Cooley-Turkey DFT algorithm is known as a representative algorithm.

Figure 3:
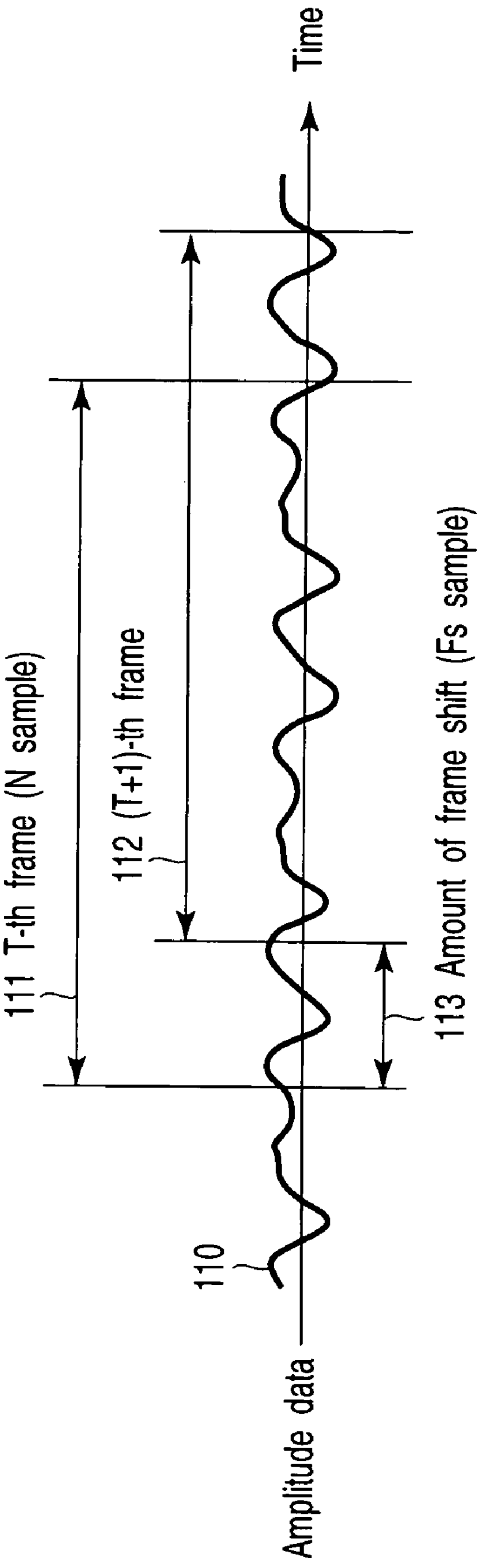
FIG. 3 is a view showing a relationship between a frame and an amount of frame shift.

As shown in FIG. 3, the frequency resolution unit 3 extracts successive N pieces of amplitude data in a form of a frame (T-th frame 111) for amplitude data 110 by the acoustic signal input unit 2 to perform the fast Fourier transform, and the frequency resolution unit 3 repeats the extraction while shifting an extraction position by an amount of frame shift 113 ((T+1)-th frame 112).

Figure 4A:
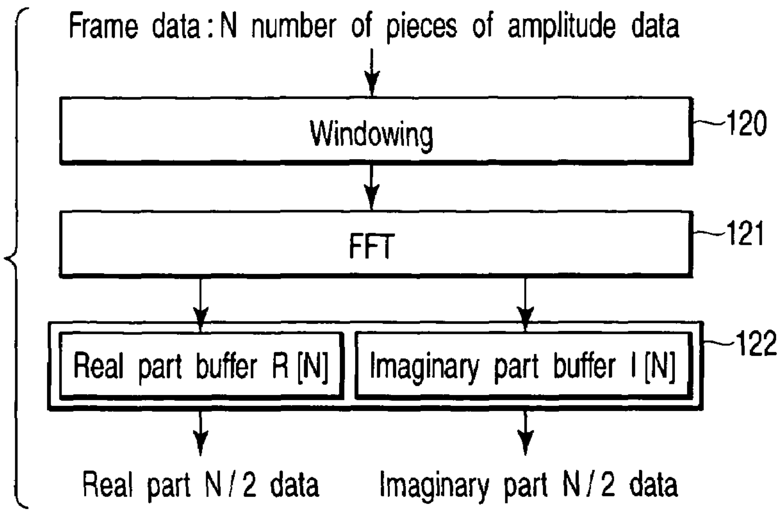
FIGS. 4A to 4C are views showing an FFT procedure and short-time Fourier transform data.
Figure 4B:
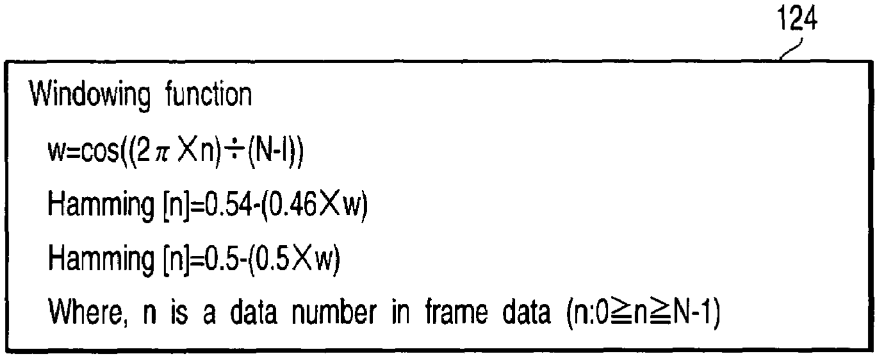

After a windowing process (120 in FIG. 4A) is performed on the amplitude data constituting the frame as shown in FIG. 4A, the fast Fourier transform (121 in FIG. 4A) is performed on the amplitude data. As a result, a real part buffer R(N) and an imaginary part buffer I(N) are generated from the short-time Fourier transform data of the inputted frame (122 in FIG. 4A). FIG. 4B shows a windowing function (Hamming window or Hanning window) 124 is shown in FIG. 4B.

Figure 4C:
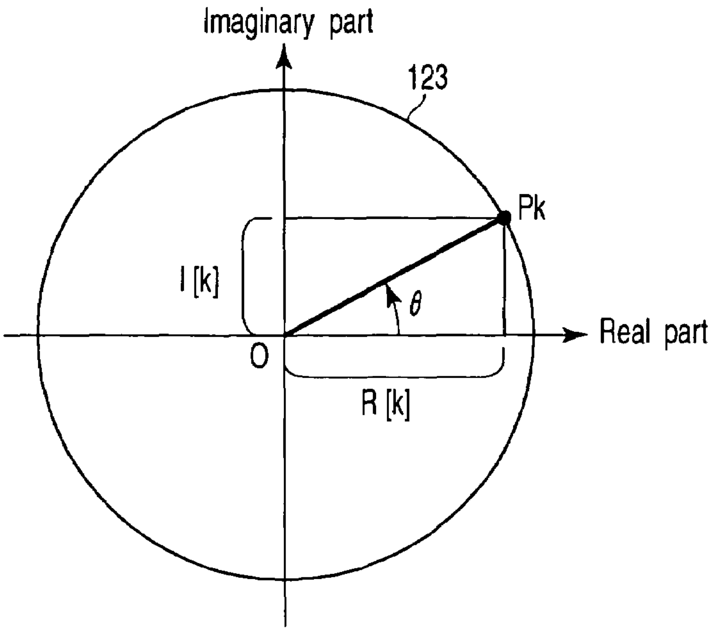

At this point, the generated short-time Fourier transform data becomes the data in which the amplitude data of the frame is resolved into the N/2 frequency components, and the numeral value of a real part R(k) and an imaginary part I(k) in the buffer 122 indicates a point Pk on a complex coordinate system 123 for a k-th frequency component fk as shown in FIG. 4C. A squared distance between Pk and an origin O corresponds to power Po(fk) of the frequency component, and a signed rotational angle θ (θ: $-\pi>\theta\geqq\pi$ (radian)) from a real part axis of Pk corresponds to a phase Ph(fk) of the frequency component.

When a sampling frequency is set at Fr (Hz) and a frame length is set at N (samples), k runs integer values from 0 to (N/2)−1. k=0 expresses 0 (Hz) (direct current) and k=(N/2)−1 expresses Fr/2 (Hz) (highest frequency component). The frequency in each k is expressed by equally dividing the distance between k=0 and k=(N/2)−1 by frequency resolution Δf=(Fr/2)/((N/2)−1) (Hz), and the frequency in each k is expressed by fK=k·Δf.

As described above, the frequency resolution unit 3 generates the frequency-resolved data in time series by continuously performing the process at predetermined intervals (the amount of frame shift Fs). The frequency-resolved data includes a power value and a phase value in each frequency of the inputted amplitude data.

[Two-Dimensional Data Generating Unit 4 and Graphics Detection Unit 5]

As shown in FIG. 5, the two-dimensional data generating unit 4 includes a phase difference computing unit 301 and a coordinate value determining unit 302, and the graphics detection unit 5 includes a voting unit 303 and a straight-line detection unit 304.

[Phase Difference Computing Unit 301]

The phase difference computing unit 301 compares two pieces of frequency-resolved data a and b obtained by the frequency resolution unit 3 at the same time, and the phase difference computing unit 301 generates the data of the phase difference between a and b obtained by computing the difference between phase values of a and b in each frequency component. As shown in FIG. 6, phase difference ΔPh(fk) of a certain frequency component fk is computed as a remainder system of 2π by computing the difference between a phase value Ph1(fk) in the microphone 1*a* and a phase value Ph2(fk) in the microphone 1*b* so that the difference falls in $-\pi<\Delta Ph(fk)\leqq\pi$.

[Coordinate Value Determining Unit 302]

The coordinate value determining unit 302 computes the difference between the phase values in each frequency component based on the phase difference data obtained by the phase difference computing unit 301, and the coordinate value determining unit 302 determines a coordinate value which deals with the phase difference data obtained by the coordinate value determining unit 302 as a point on a predetermined two-dimensional XY coordinate system. An X-coordinate value x(fk) and a Y-coordinate value y(fk) corresponding to the phase difference ΔPh(fk) of the frequency component fk are determined by equations shown in FIG. 7. The X-coordinate value is phase difference ΔPh(fk) and the Y-coordinate value is the frequency component number k.

[Frequency Proportionality of Phase Difference for the Same Time Difference]

Figure 8A:
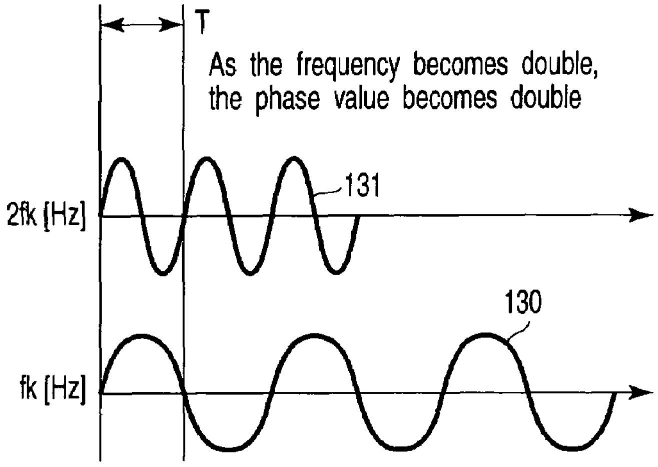
FIGS. 8A and 8B are views showing a proportional relationship between a frequency and a phase for the same time and a proportional relationship between the frequency and the phase for the same time reference.
Figure 8B:
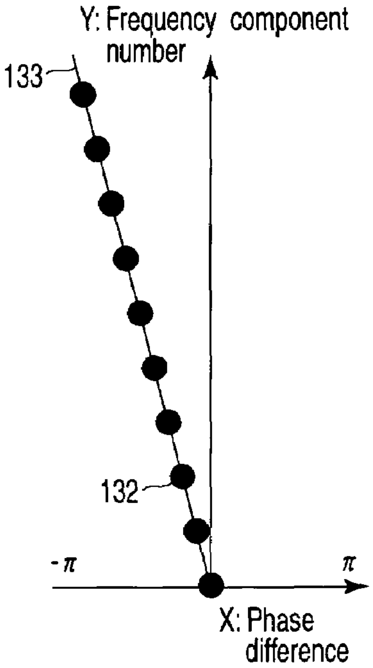

The phase difference which is computed in each frequency component by the phase difference computing unit 301 as shown in FIG. 6 should indicate the same arrival time difference as those derived the from same sound source (the same direction). At this point, since the frequency phase value obtained by FFT and the phase difference between the microphones are computed by setting the frequency period at 2π, even in the same time difference, the phase difference becomes double when the frequency becomes double. FIG. 8 shows the proportional relationship between the frequency and the phase difference. As shown in FIG. 8A, a wave 130 having the frequency fk (Hz) is a half period for a time T, i.e. the wave 130 includes a phase interval of π. On the other hand, a wave 131 having the frequency of 2 fk which doubles the frequency of the wave 130 is one period, i.e. the wave 131 includes the phase interval of 2π. Similarly, the phase difference for the same arrival time difference ΔT is increased in proportion to the frequency. FIG. 8B shows the proportional relationship between the phase difference and the frequency. When the phase differences ΔT of the frequency components derived from the same sound source are plotted on the two-dimensional coordinate system by the coordinate value computation shown in FIG. 7, coordinate points 132 indicating the phase differences of the frequency components are arranged on a line 133. As the arrival time difference ΔT is increased, i.e. as the difference between the distances from both microphones to the sound source is increased, a gradient of the line is increased.

[Cyclicity of Phase Difference]

However, the proportionality of the frequency and the phase difference between the microphones is held in all the ranges as shown in FIG. 8B only when the true phase difference does not depart from ±π in the range from the minimum frequency to the maximum frequency. This condition means that the arrival time difference ΔT is lower than a time of a half period of the maximum frequency (half of sampling frequency) Fr/2 (Hz), i.e. the arrival time difference ΔT is lower than 1/Fr (second). When the arrival time difference ΔT is 1/Fr or more, it is necessary to consider that only the phase difference is obtained as the value having cyclicity as described below.

Figure 9:
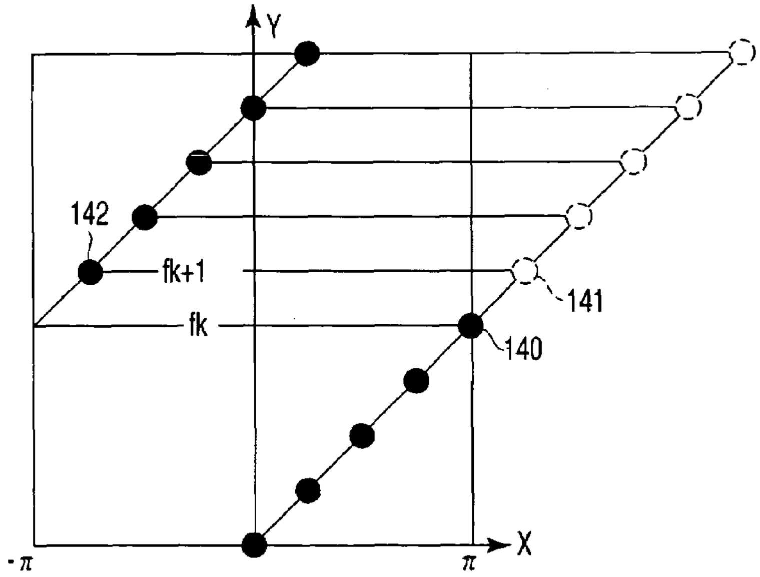
FIG. 9 is a view for explaining cyclicity of the phase difference.

The available phase value in each frequency component can be obtained as the value of the rotational angle θ shown in FIG. 4 only by a width of 2π (2π width from −π to π in the embodiment). This means that, even if the actual phase difference between the microphones becomes wider to one period or more, the actual phase difference cannot be known from the phase value obtained as a result of the frequency resolution. Therefore, in the embodiment, the phase difference is obtained in the range from −π to π as shown in FIG. 6. However, there is a possibility that the true phase difference caused by the arrival time difference ΔT is a value in which 2π is added to or subtracted from the determined phase difference value or 4π or 6π is added to or subtracted from the determined phase difference value. This is schematically shown in FIG. 9. Referring to FIG. 9, when the phase difference ΔPh(fk) of the frequency fk is +π as shown by a dot 140, the phase difference of the frequency fk+1 which is higher than the frequency fk by one level exceeds +π as shown by a white circle 141. However, the computed phase difference ΔPh(fk+1) becomes the value which is slightly larger value than −π as shown by a dot 142. The computed phase difference ΔPh(fk+1) is the value in which the 2π is subtracted from the original phase difference. Further, a similar value is obtained (not shown) even in the triple frequency, and it is the value in which 4π is subtracted from the actual phase difference. Thus, the phase difference circulates in the range from −π to π as the remainder system of 2π as the frequency is increased. When the arrival time difference is increased, the true phase difference indicated by the white circle circulates inversely as shown by the dot in the ranges above the frequency fk+1.

[Phase Difference When Plural Sound Source Exist]

Figure 10A:
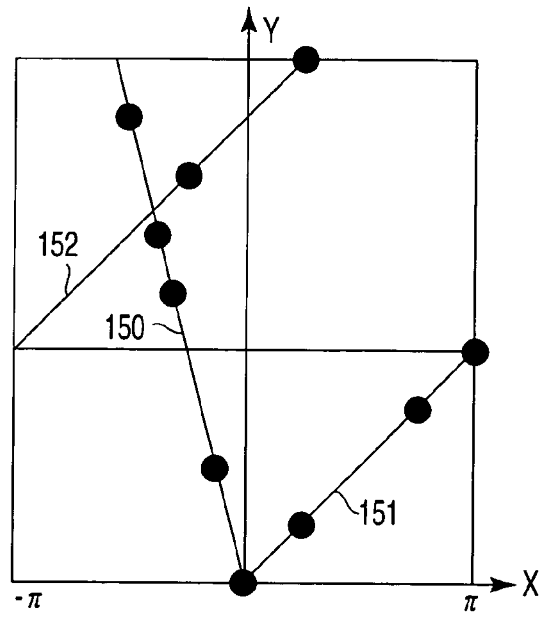
FIGS. 10A and 10B are views each showing a frequency-phase difference plot when plural sound sources exist.
Figure 10B:
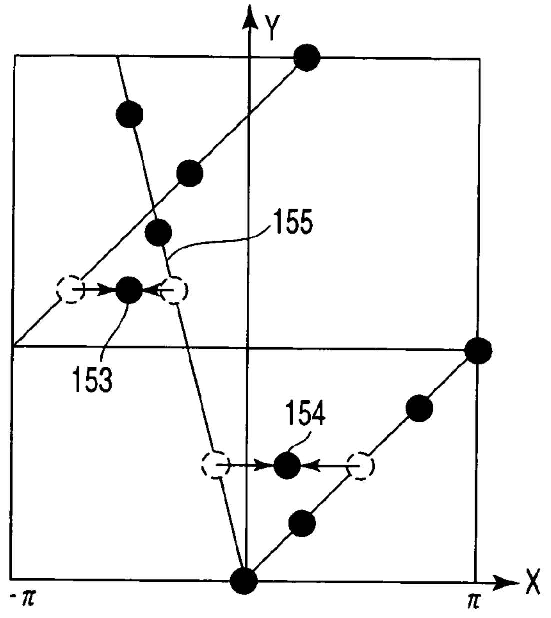

On the other hand, when the acoustic waves are generated from the plural sound sources, a frequency-phase difference plot is schematically shown in FIG. 10. FIG. 10 shows the case in which the two sound sources exist in the different directions with respect to the pair of microphones, the case in which the two source sounds do not include the same frequency components, and the case in which the two source sounds include a part of the same frequency components. Referring to FIG. 10A, the phase differences of the frequency components having the same arrival time reference ΔT coincide with any one of the lines, five points are arranged on a line 150 having a small gradient, and six points are arranged on a line 151 (including a circulating line 152). Referring to FIG. 10B, in two frequency components 153 and 154 included in both the source sounds, the acoustic waves are mixed together and the phase difference does not emerge correctly. Therefore, some points run off from the lines, particularly only three points coincide with a line 155 having the small gradient.

The problem that the number of source sounds and the directions of the sound sources are estimated can come down to discovery of the line such as the lines in the plot of FIG. 10; Further, the problem that the frequency component is estimated in each sound source can come down to selection of the frequency component arranged in the position near the detected line. Accordingly, the point group or the image in which the point group is arranged (plotted) on the two-dimensional coordinate system is used as the two-dimensional data outputted from the two-dimensional data generating unit 4 in the apparatus of the embodiment. The point group is determined as the function of the frequency and the phase difference using two pieces of the frequency resolved data by the frequency resolution unit 3. The two-dimensional data is defined by two axes which do not include a time axis, so that three-dimensional data can be defined as the time series of the two-dimensional data. The graphics detection unit 5 detects the linear arrangement as the graphics from the point group arrangement given as the two-dimensional data (or three-dimensional data which is of the time series of the two-dimensional data).

[Voting Unit 303]

As described later, the voting unit 303 applies a linear Hough transform to each frequency component to which the (x, y) coordinate is given by the coordinate value determining unit 302, and the voting unit 303 votes its locus in a Hough voting space by a predetermined method. Although A. Okazaki, "Primary image processing," Kogyotyousakai, p 100-102 (2000) describes the Hough transform, the Hough transform will be described here again.

Linear Hough Transform

Figure 11:
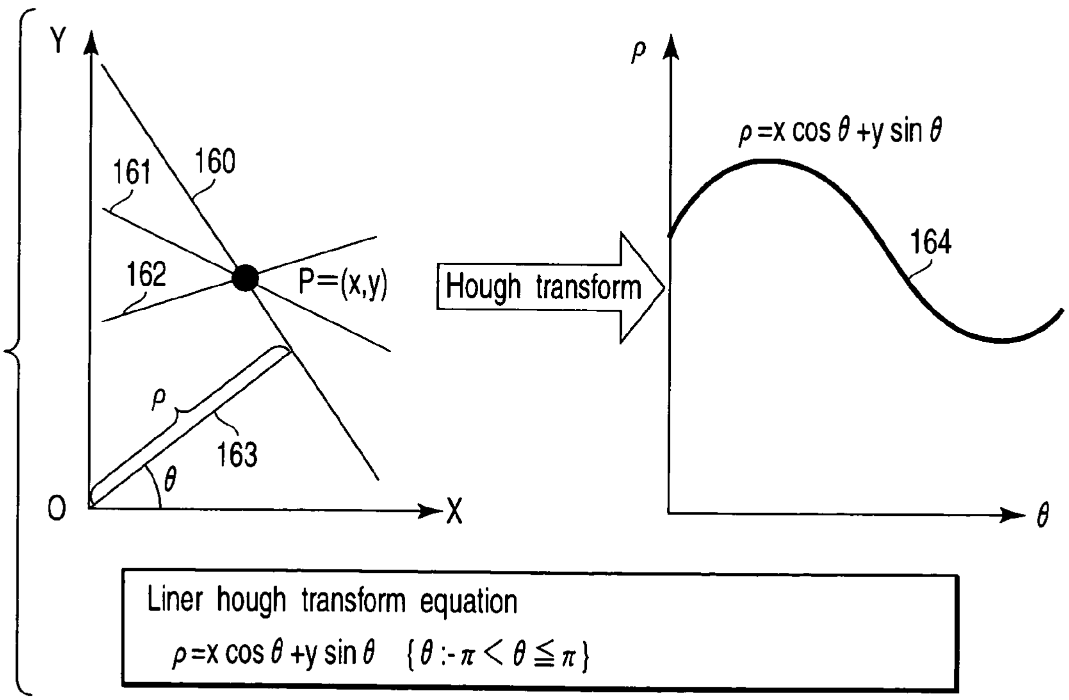
FIG. 11 is a view for explaining linear Hough transform.

As schematically shown in FIG. 11, an infinite number of lines which can pass through a point (x, y) on the two-dimensional coordinate exists like lines 160, 161, and 162 in FIG. 11. However, assuming that the gradient of a perpendicular 163 dropped from the origin O to each line is set at θ relative to the X-axis and a length of the perpendicular 163 is set at ρ, θ and ρ are uniquely determined with respect to one line, it is known that a set of θ and ρ of the line passing through the point (x, y) draws a unique locus 164 ($\rho = x\cos\theta + y\sin\theta$) for the value of (x, y) on a θ-ρ coordinate system. Thus, the transform of the line passing through the (x, y) coordinate value into the locus of (θ, ρ) is referred to as linear Hough transform. θ should have a positive value when the line is inclined leftward, θ should be zero when the line is vertical, θ should have the negative value when the line is inclined rightward, and θ never runs off from the defined range of $-\pi < \theta \leqq \pi$.

Figures 12, 13:
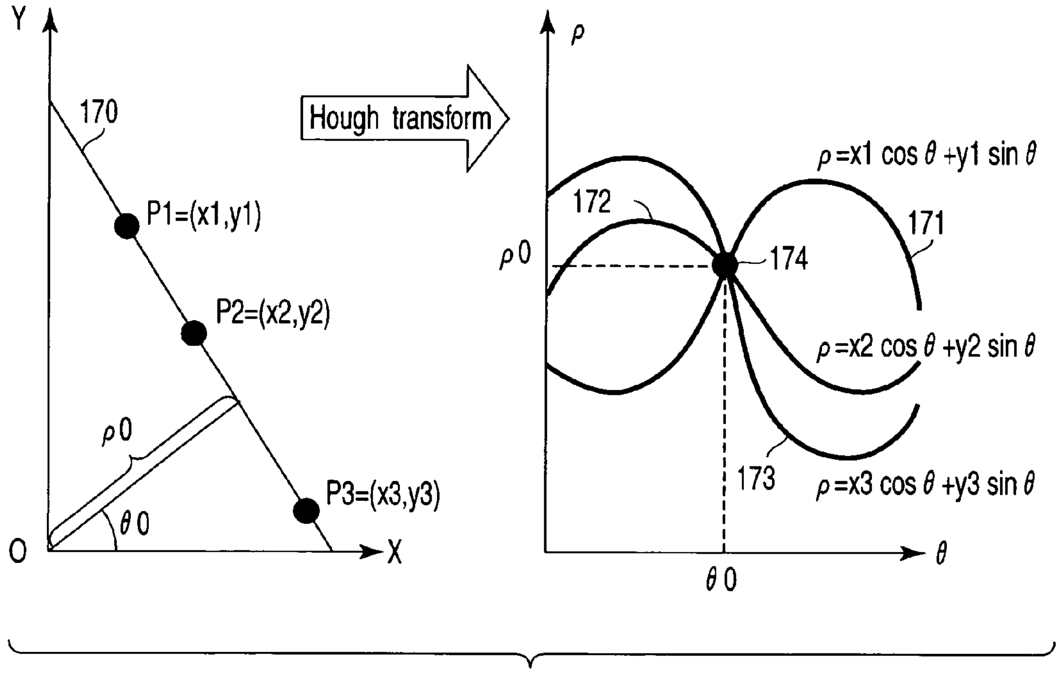
FIG. 12 is a view for explaining detection of a straight line from a point group by Hough transform.
FIG. 13 is a view showing a voted average power function (computing formula)

A Hough curve can independently be determined with respect to each point on the XY coordinate system. As shown in FIG. 12, a line 170 passing through three points p1, p2, and p3 can be determined as the line defined by a coordinate (θ0, ρ0) of a point 174 at which the loci 171, 172, and 173 corresponding to the points p1, p2, and p3 intersecting one another. As the line passes through the more points, the more loci pass through the position of (θ, ρ) expressing the line. Thus, the Hough transform is preferably used for the detection of the line from the point group.

[Hough Voting]

The engineering technique of Hough voting is used in order to detect the line from the point group. This is a technique of suggesting the set of θ and ρ through which many loci pass, i.e. the existence of the line at the position where a large number of votes is obtained in the Hough voting space such that the set of θ and ρ through which each locus passes is voted in a two-dimensional Hough voting space having the coordinate axes of θ and ρ. Generally, a two-dimensional array (Hough voting space) having a searching range size for θ and ρ is prepared and the two-dimensional array is initialized by zero. Then, the locus is determined at each point by the Hough transform, and a value on the array through which the locus passes is incremented by 1. This is referred to as Hough voting. When the vote of the locus is ended for all the points, it is found that the line does not exist at the position where the number of votes is 0 (no locus passes through), the line passing through one point exists at the position where the number of votes is 1 (only one locus passes through), the line passing through two points exists at the position where the number of votes is 2 (only two loci pass through), and the line passing through n points exists at the position where the number of votes is n (only n loci pass through). When the resolution of the Hough voting space can be increased to infinity, as described above, only the point through which the locus passes obtains the number of votes corresponding to the number of loci passing through the point. However, because the actual Hough voting space is quantized with the proper resolution for θ and ρ, the high vote distribution is also generated near the position where the plural loci intersect one another. Therefore, it is necessary that the loci intersecting position is determined more accurately by searching for the position having the maximum value from the vote distribution of the Hough voting space.

The voting unit 303 performs Hough voting for frequency components satisfying all the following conditions. Due to the conditions, only the frequency component having a power not lower than a predetermined threshold in a given frequency band is voted:

(Voting condition 1): The frequency is in a predetermined range (low-frequency cut and high-frequency cut), and (Voting condition 2): Power P(fk) of the frequency component fk is not lower than the predetermined threshold.

The voting condition 1 is generally used in order to cut out the low frequency on which background noise is superposed or to cut the high frequency in which the accuracy of FFT is decreased. The ranges of the low-frequency cut and the high-frequency cut out can be adjusted according to the operation. When the widest frequency band is used, it is preferable that only a direct-current component is cut in the low-frequency cut and only the maximum frequency is cut in the high-frequency cut.

In the frequency component in which the background noise level is very weak, it is thought that the reliability of FFT result is not so high. The voting condition 2 is used in order that the frequency component having the low reliability is caused not to participate in the vote by performing the threshold process with the power. Assuming that the power value is set at Po1(fk) in the microphone 1*a* and the power value is set at Po2(fk) in the microphone 1*b*, the method of determining the estimated power P(fk) includes the following three conditions. The use of the conditions can be set according to the operation.

(Average value): An average value of Po1(fk) and Po2(fk) is used. It is necessary that both the power values of Po1(fk) and Po2(fk) are appropriately strong.

(Minimum value): The lower one of Po1(fk) and Po2(fk) is used. It is necessary that both the power values of Po1(fk) and Po2(fk) are not lower than the threshold value at the minimum.

(Maximum value): The larger one of Po1(fk) and Po2(fk) is used. Even if one of the power values is lower than the threshold value, the vote is performed when the other power value is sufficiently strong.

Further, the voting unit 303 can perform the following two addition methods in the vote.

(Addition method 1): A predetermined fixed value (for example, 1) is added to the position through which the locus passes.

(Addition method 2): A function value of power P(fk) of the frequency component fk is added to the position through which the locus passes.

The addition method 1 is usually used in the line detection problem by the Hough transform. In the addition method 1, because the vote is ranked in proportion to the number of passing points, it is preferable to detect the line (i.e. sound source) including the many frequency components on a priority basis. At this point, because there is no limitation to the harmonic structure (in which the included frequencies should be equally spaced) with respect to the frequency component included in the line, in addition to human voice, more sound sources can be detected.

Even if a small number of passing points exists, in the addition method 2, the high-order maximum value can be obtained when the frequency component having a large power is included. It is preferable to detect the line (i.e. sound source) having a promising component in which the power is large while the number of frequency components is small. The function value of the power P(fk) is computed as G(P(fk)) in the addition method 2. FIG. 13 shows a computing formula of G(P(fk)) when P(fk) is set at the average value of Po1(fk) and Po2(fk). In addition, as with the voting condition 2, P(fk) can also be computed as the minimum value or the maximum value of Po1(fk) and Po2(fk). In the addition method 2, P(fk) can be set independently of the voting condition 2 according to the operation. A value of an intermediate parameter V is computed as a value in which predetermined offset α is added to logarithm $\log_{10}P(fk)$. When the intermediate parameter V is positive, the value of V+1 is set at the value of the function G(P(fk)). When the intermediate parameter V is not more than zero, the value of 1 is set at the value of the function G(P(fk)). Like the addition method 2, by voting 1 at the minimum, the line (sound source) including the frequency component having the large power emerges to the high order, and the line (sound source) including the large number of frequency components emerges to the high order. Therefore, the addition method 2 can also have the majority decision characteristics of the addition method 1. The voting unit 303 can perform either the addition method 1 or the addition method 2 according to the setting. Particularly the voting unit 303 can also simultaneously detect the sound source having the small number of frequency components by using the addition method 2, which allows more sound sources to be detected.

[Collective Voting of Plural FFT Results]

Further, although the voting unit 303 can perform the voting in each FFT time, in the embodiment, the voting unit 303 performs collective voting for the usually successive m-time (m≧1) time-series FFT results. On a long-term basis, the frequency component of a sound source fluctuates. However, when the voting unit 303 performs collective voting for the successive m-time time-series FFT results, a Hough voting result having higher reliability can be obtained with more pieces of data obtained from the plural-time FFT results having properly short-time when the frequency component is stable. m can be set as the parameter according to the operation.

[Straight-Line Detection Unit 304]

The straight-line detection unit 304 detects a promising line by analyzing the vote distribution on the Hough voting space generated by the voting unit 303. However, at this point, a higher-accuracy line detection can be realized by considering the situation unique to the problem, such as the cyclicity of the phase difference described in FIG. 9.

Figure 14:
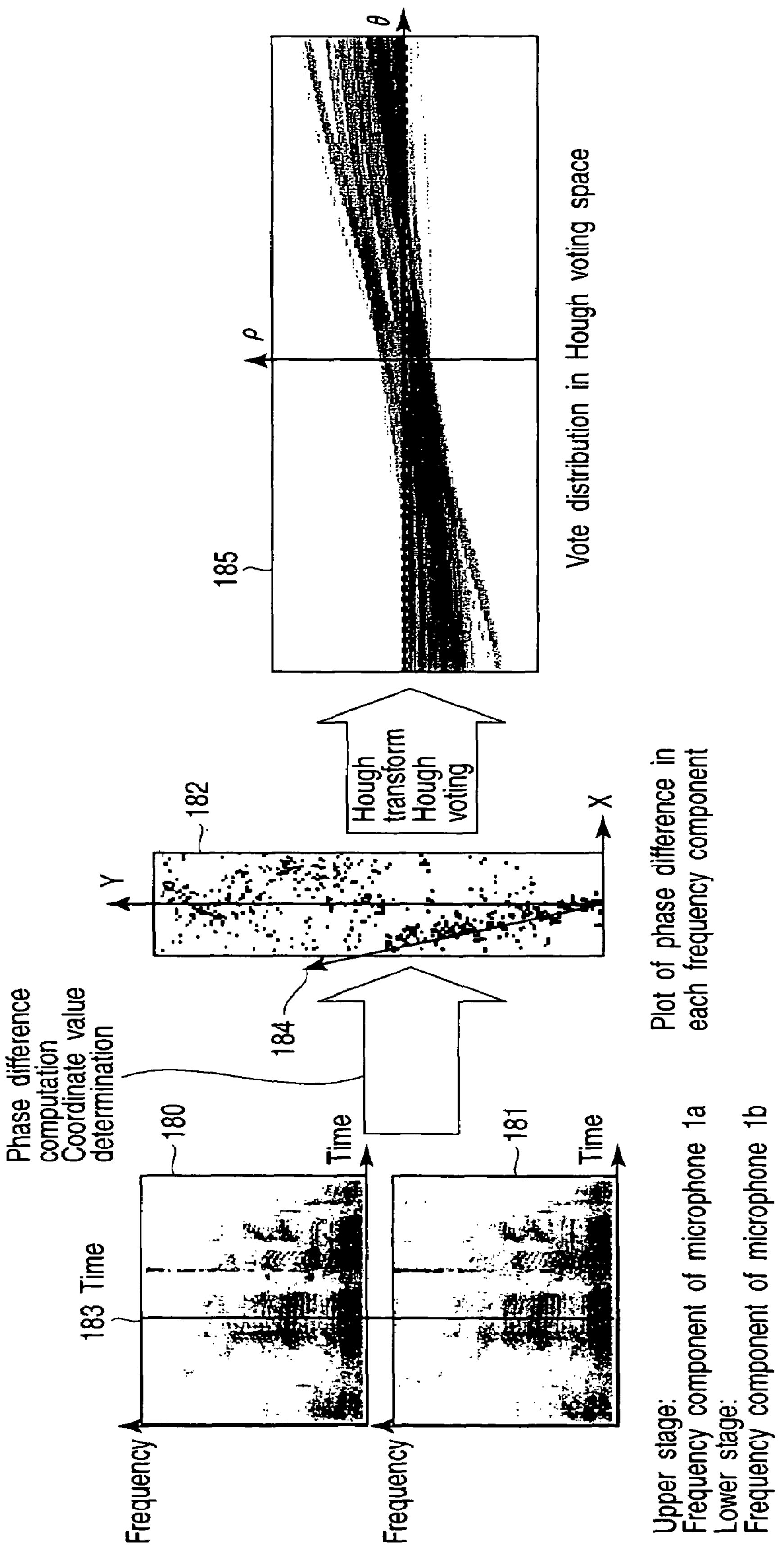
FIG. 14 is a view showing a frequency component generated from actual sound, a frequency-phase difference plot, and Hough voting result.

FIG. 14 shows a power spectrum of the frequency component, a frequency-phase difference plot obtained from the FFT result of five successive times (m=5), and the Hough voting result (vote distribution) obtained from the FFT result of the successive five times, when the processing is performed using an actual voice with which one person speaks from about 20 degrees leftward relative to the front face of the pair of microphones in a room noise environment. The processes from the start to FIG. 14 are performed by the series of functional blocks from the acoustic signal input unit 2 to the voting unit 303.

The amplitude data obtained by the pair of microphones is converted into power value data and phase value data of each frequency component by the frequency resolution unit 3. Referring to FIG. 14, the numerals 180 and 181 designates brightness display of the power-value logarithm in each frequency component. In FIG. 14, a time is set at the horizontal axis. As the dot density becomes higher, the power value is increased. One vertical line corresponds to one-time FFT result, and the FFT results are graphed along with time (rightward direction). The numeral 180 designates the result in which the signals from the microphone 1*a* are processed, the numeral 181 designates the result in which the signals from the microphone 1*b* are processed, and a large number of frequency components is detected. The phase difference computing unit 301 receives the frequency resolved result to determine the phase difference in each frequency component. Then, the coordinate value determining unit 302 computes the XY coordinate value (x, y). In FIG. 14, the numeral 182 represents a plot of the phase difference obtained by the successive five-time FFT from a time 183. In the plot 183, it is recognized that a point-group distribution exists along a leftward inclined line 184 extending from the origin, however, the point-group distribution does not clearly run on the line 184 and many points exist separated from the line 184. The voting unit 303 votes each of the points having the point-group distribution in the Hough voting space to form a vote distribution 185 which is generated by the addition method 2.

[Limitation of ρ=0]

Figure 15:
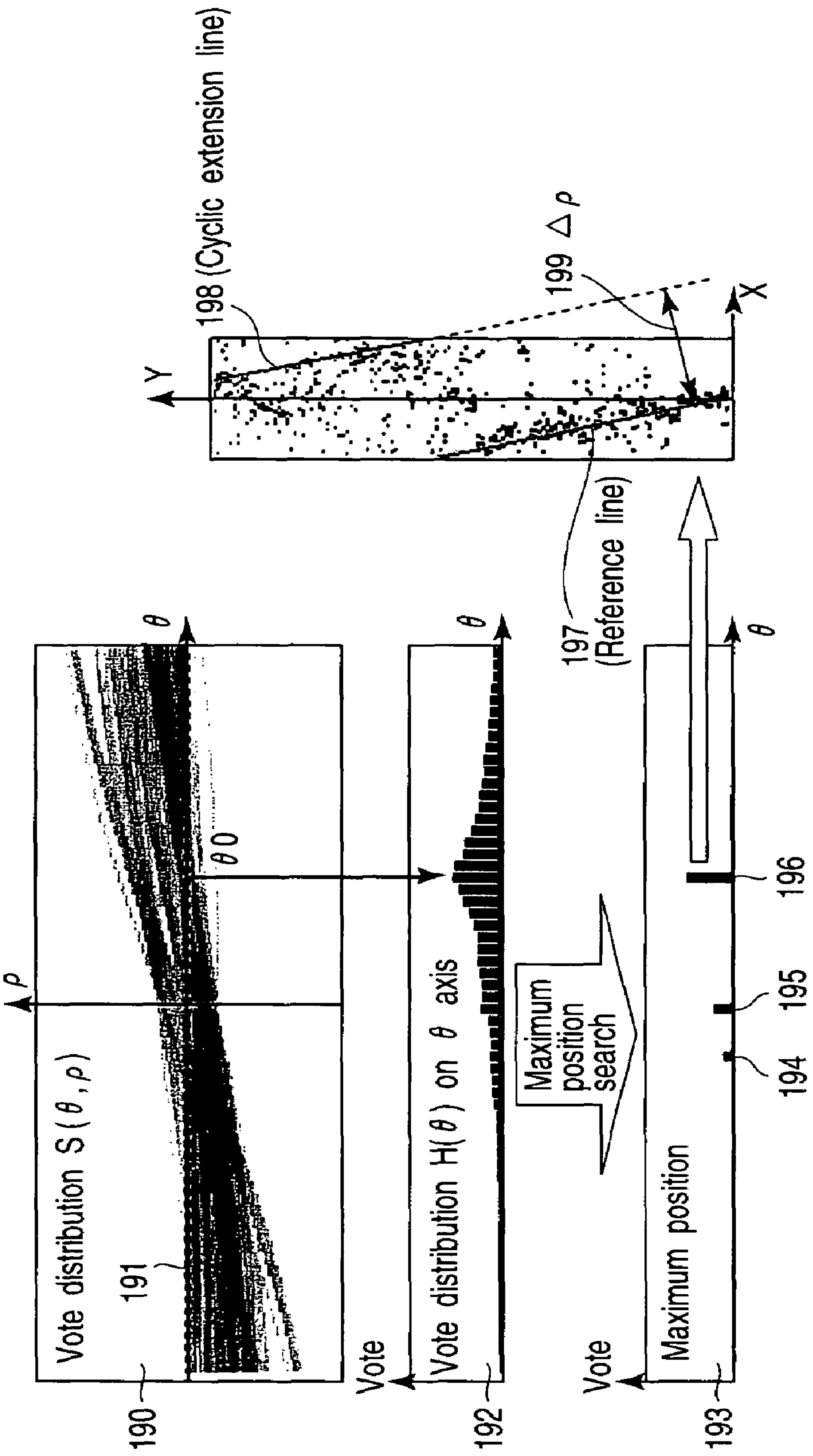
FIG. 15 is a view showing a maximum position determined from the actual Hough voting result and a straight line.

When analog-to digital conversion is performed in phase to the signals of the microphone 1*a* and the microphone 1*b* by the acoustic signal input unit 2, the line which should be detected always passes through ρ=0, i.e. the origin of the XY coordinate system. Therefore, the sound source estimation problem comes down to the problem that the maximum value is searched for from the vote distribution S(θ, 0) located on the θ axis in which ρ becomes zero on the Hough voting space. FIG. 15 shows the result in which the maximum value is searched for on the θ axis with respect to the data illustrated in FIG. 14.

Referring to FIG. 15, the numeral 190 designates the same vote distribution as the vote distribution 185 in FIG. 13. The numeral 192 of FIG. 15 is a bar chart in which a vote distribution S(θ, 0) on a θ axis 191 is extracted as H(θ). Some maximum points (projected portions) exist in the vote distribution H(θ). The straight-line detection unit 304 correctly detects θ of the line which obtains sufficient votes in the following processes: (1) In performing the search for θ having a vote at a certain position in the vote distribution H(θ) as long as θ having the same value continues right and left, the straight-line detection unit 304 finally leaves the point where θ having the vote lower than that of θ located at a certain position. Accordingly, maximum portions are extracted on the vote distribution H(θ). However, in the extracted maximum portions, the maximum portion having a flat peak is included and the maximum values continue. (2) Therefore, as shown by the numeral 193 of FIG. 15, the straight-line detection unit 304 leaves only the center positions of the maximum portions as the maximum position by a thinning process. (3) Finally the straight-line detection unit 304 detects only the maximum position, where the vote is not lower than the predetermined threshold, as the line. In the example of FIG. 15, the maximum positions 194, 195, and 196 are detected in the above process (2), and the maximum position 194 is left by the thinning process of the flat maximum portion (right side has a priority in the even-numbered maximum portion). Further, only the maximum portion 196 is the line which is detected by obtaining the vote not lower than the threshold. The numeral 197 of FIG. 15 designates a line defined by θ and ρ (=0) given by the maximum position 196. The thinning of the "Tamura method" which is described in A. Okazaki, "Primary image processing," Kogyotyousakai, p 89-92, 2000 can be used as the algorithm of the thinning process. When the straight-line detection unit 304 detects one or more maximum points (center position obtaining the vote not lower than the predetermined threshold), the straight-line detection unit 304 ranks the maximum point in order of the multitude of vote to output the values of θ and ρ of each maximum position.

[Definition of Line Group in Consideration of Phase Difference Cyclicity]

A line 197 shown in FIG. 15 is one which passes through the origin of the XY coordinate system defined by the maximum position 196 (θ0, 0). A line 198 is also the line indicating the same arrival time difference as the line 197. The line 198 is formed by the cyclicity of the phase difference such that the line 197 is moved in parallel by Δρ (199 in FIG. 15) and circulated from the opposite side on the X-axis. The line in which a part protruding an X region by extending the line 197 emerges in a circulated manner from the opposite side is referred to as "cyclic extension line" of the line 197, the line 197 which is of the reference line with respect to the cyclic extension line is referred to as "reference line." When the reference line 197 is further inclined, the number of cyclic extension lines is increased. At this point, a coefficient α is set at an integer 0 or more, and all the lines having the same arrival time difference belong to a line group (θ0, aΔρ) in which the reference line 197 defined by (θ0, 0) is moved in parallel by Δρ. With reference ρ which is of the starting point, when ρis generalized as ρ=ρ0 by removing the limitation of ρ=0, the line group can be described as (θ0, aΔρ+ρ0). At this pint, Δρ is a signed value defined as a function Δρ(θ) having the line gradient θ by the equations shown in FIG. 16.

Figure 16:
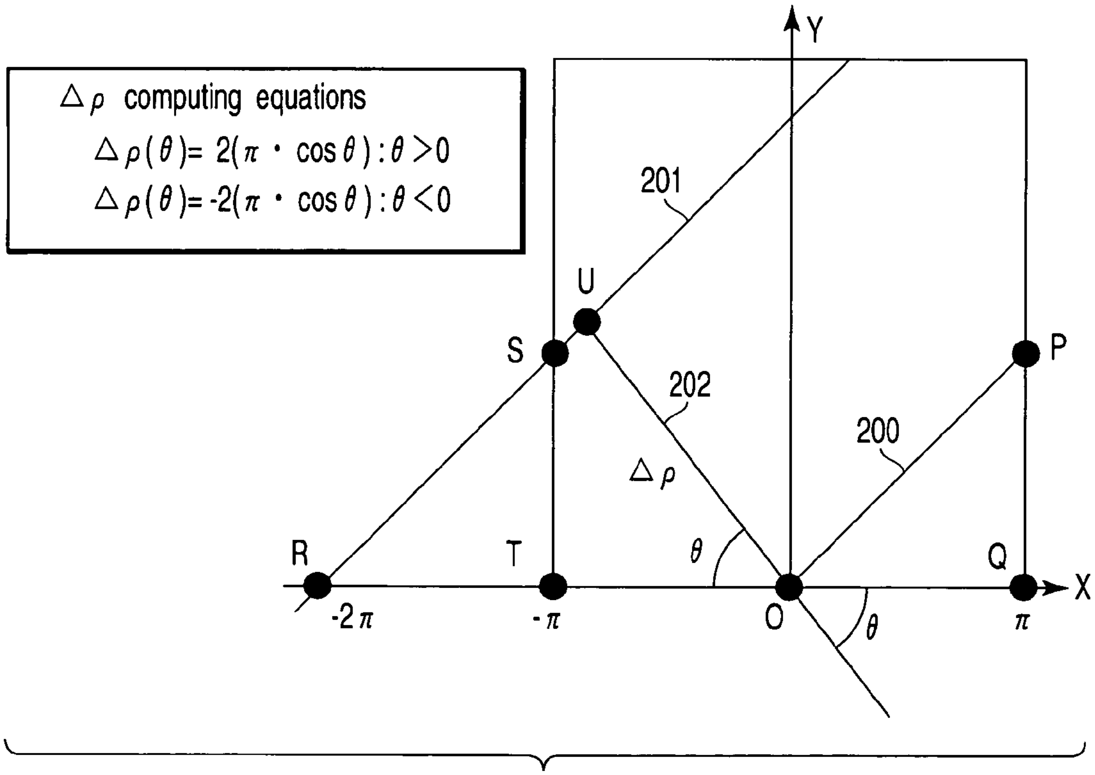
FIG. 16 is a view showing a relationship between θ and Δρ.

Referring to FIG. 16, the numeral 200 designates a reference line defined by (θ, 0). In this case, since the reference line is inclined rightward, θ has a negative value according to the definition. However, in FIG. 16, θ is dealt with as an absolute value. The numeral 201 designates a cyclic extension line of a reference line 201, and the cyclic extension line 200 intersects the X-axis at a point R. An interval between the reference line 200 and the cyclic extension line 201 is Δρ as shown by an additional line 202. The additional line 202 intersects the reference line 200 at a point O, and the additional line 202 perpendicularly intersects the cyclic extension line 201 at a point U. At this point, since the reference line is inclined rightward, Δρ has a negative value according to the definition. However, in FIG. 16, Δρ is dealt with as the absolute value. In FIG. 16, a triangle OQP is a right-angled triangle in which a side OQ has a length of π, and a triangle RTS is congruent to the triangle OQP. Therefore, it is found that a side RT also has the length of π and a hypotenuse OR of a triangle OUR has the length of 2π. At this point, Δρ is the length of the side OU, leading to $\Delta\rho=2\pi\cdot\cos\theta$. In consideration of the signs of θ and Δρ, the equations of FIG. 16 can be derived.

[Maximum Position Detection in Consideration of Phase Difference Cyclicity]

As described above, the sound source is no expressed by one line, but the sound source is dealt with as the line group including the reference line and the cyclic extension line due to the cyclicity of the phase difference. This should also be considered in detecting the maximum position from the vote distribution. Usually the method of searching for the maximum position with the vote value on ρ=0 (or $\rho=\rho 0$) (i.e. vote value of reference line) is sufficient from a performance viewpoint, and the method also has an effect of reducing the searching time and improving the accuracy, in the case where the cyclicity of the phase difference does not occur, or in the case where the sound source is detected only near the front face of the pair of microphones even if the cyclicity occurs. However, in the case where the sound source which exists in the wider range is detected, it is necessary for the maximum position to be searched for by summing the vote values at some points separated from one another by Δρ for a certain θ. The difference will be described below.

Figure 17:
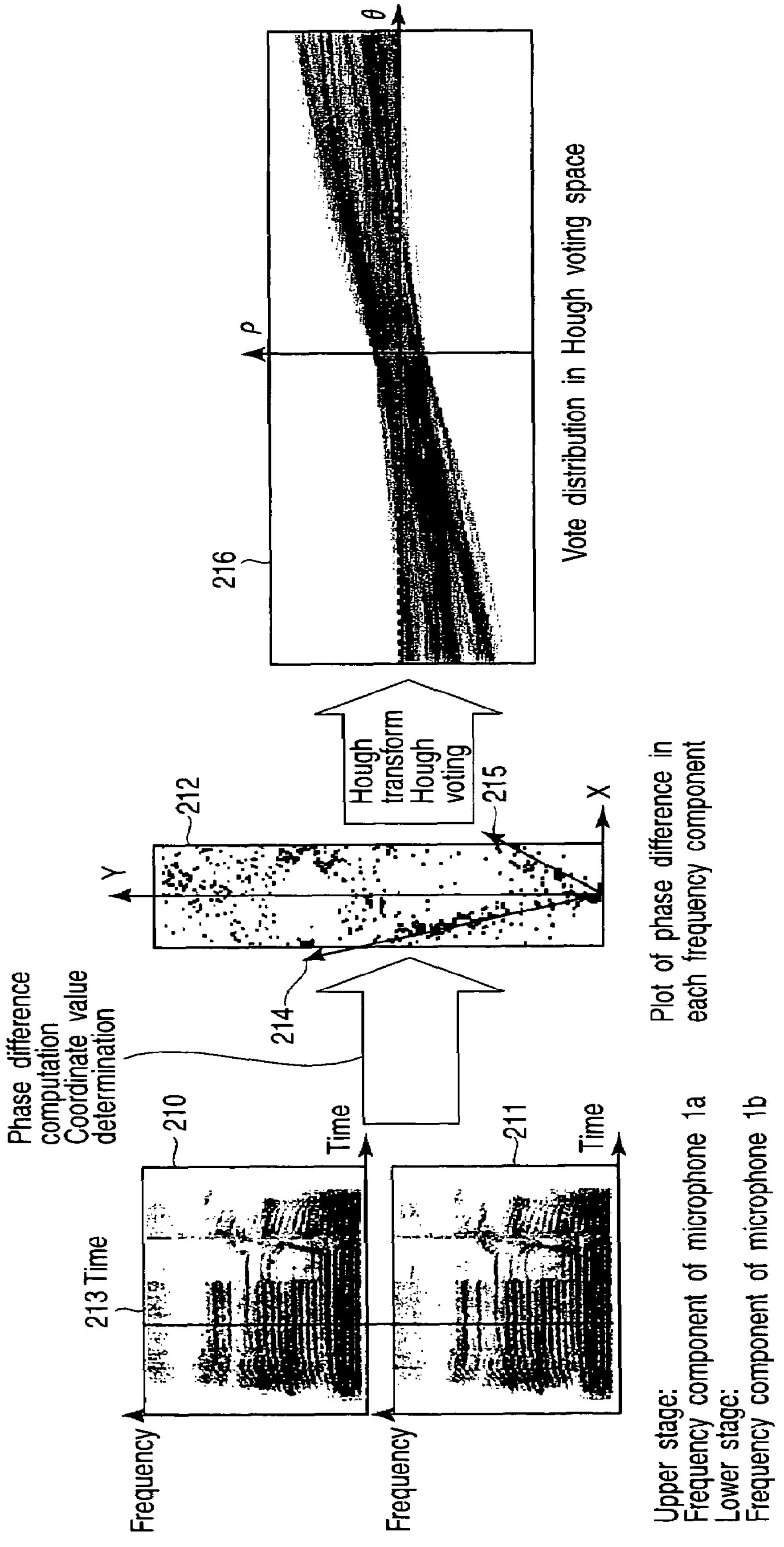
FIG. 17 is a view showing the frequency component, the frequency-phase difference plot, and the Hough voting result when two persons speak simultaneously.

FIG. 17 shows the power spectrum of the frequency component, the frequency-phase difference plot obtained from the FFT result of the successive five times (m=5), and the Hough voting result (vote distribution) obtained from the FFT result of the successive five times, when the processing is performed using the actual voice with which two persons speak from about 20 degrees leftward and from about 45 degrees rightward relative to the front face of the pair of microphones in a room noise environment.

The frequency resolution unit 3 converts the amplitude data obtained by the pair of microphones into the power value data and the phase value data of each frequency component. Referring to FIG. 17, the numerals 210 and 211 designate brightness display of the power-value logarithm in each frequency component. In FIG. 17, the frequency is given on vertical axis and time is given on the horizontal axis. As the dot density becomes higher, the power value is increased. The vertical one line corresponds to one-time FFT result, and the FFT results are graphed along with time (rightward direction). The numeral 210 designates the result in which the signals from the microphone 1*a* are processed, the numeral 211 designates the result in which the signals from the microphone 1*b* are processed, and a large number of frequency components is detected. The phase difference computing unit 301 receives the frequency resolved result to determine the phase difference in each frequency component. Then, the coordinate value determining unit 302 computes the XY coordinate value (x, y). In FIG. 17, the numeral 212 represents a plot of the phase difference obtained by the successive five-time FFT from a time 213. In the plot 212, it is recognized that the point-group distribution exists along a reference line 214 inclined leftward from the origin and the point-group distribution exists along a reference line 215 inclined rightward from the origin. The voting unit 303 votes each of the points having the point-group distribution in the Hough voting space to form a vote distribution 216 which is generated by the addition method 2.

Figure 18:
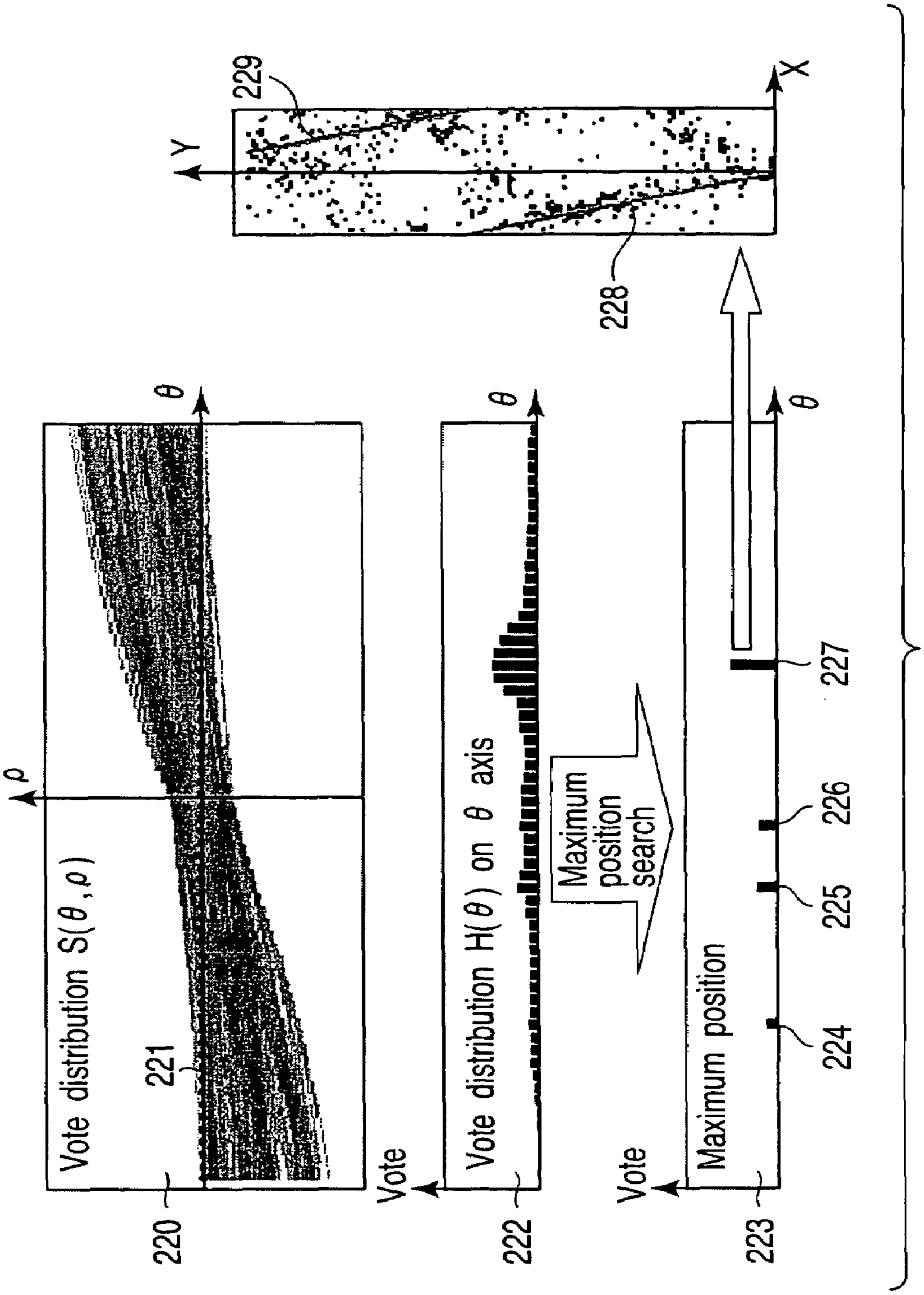
FIG. 18 is a view showing result in which the maximum position is searched only by a vote value on a θ axis.

FIG. 18 shows the result in which the maximum position is searched for only by the vote value on the θ axis. Referring to FIG. 18, the numeral 220 designates the same vote distribution as the vote distribution 216 in FIG. 17. The numeral 222 of FIG. 18 represents a bar graph in which the vote distribution S(θ, 0) on a θ axis 221 is extracted as H(θ). Some maximum points (projected portions) exist in the vote distribution H(θ). As can be seen from the vote distribution H(θ) in the numeral 222, generally, the number of vote is decreased, as the absolute value of θ is increased. As shown by the numeral 223 of FIG. 18, four maximum positions 224, 225, 226, and 227 are detected in the vote distribution H(θ). Only the maximum position 227 obtains a vote not lower than the threshold to detect one line group (reference line 228 and cyclic extension line 229). The line group detects the voice from about 20 degrees leftward relative to the front face of the pair of microphones. However, the voice cannot be detected from about 45 degrees rightward relative to the front face of the pair of microphones. In the reference line passing through the origin, as the angle of the line is increased, the line can pass through a lower frequency band until the line exceeds the value range of X. Therefore, the width of the frequency band through which the reference line passes depends on θ (unequal). Since the limitation of ρ=0 compete in the vote of only the reference line under unequal condition, a line having a large angle becomes disadvantaged in the vote. This is the reason why the voice cannot be detected from about 45 degrees rightward.

Figure 19:
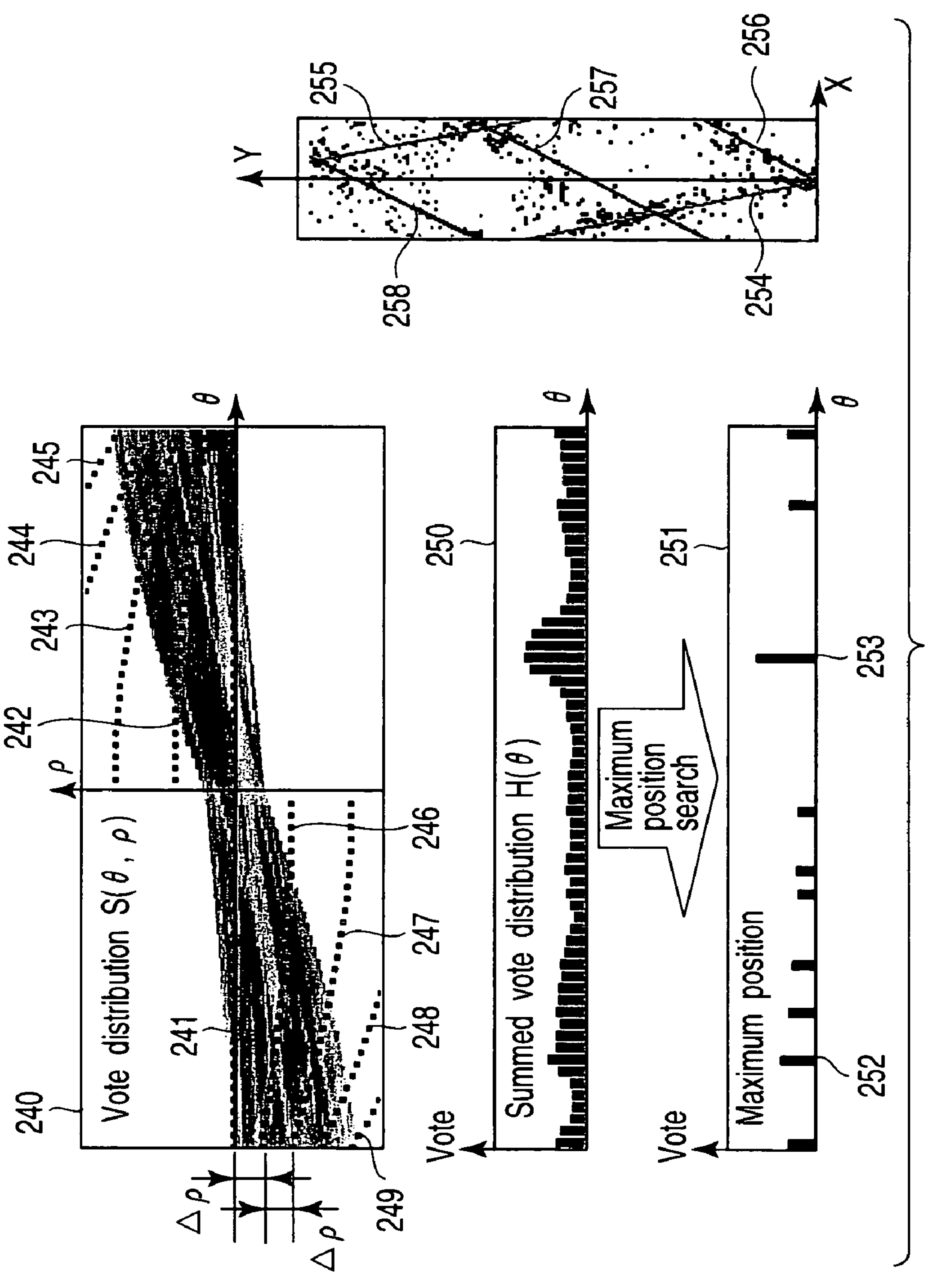
FIG. 19 is a view showing result in which the maximum position is searched by summing the vote values of some points located at Δρ intervals.

On the other hand, FIG. 19 shows the result in which the maximum position is searched for by summing the vote values of some points located at Δρ intervals. The numeral 240 of FIG. 19 represents the positions of ρ by broken lines 242 to 249 when the line passing through the origin is moved in parallel by Δρ on the vote distribution 216 of FIG. 17. At this point, a θ axis 241 and the broken lines 242 to 245 and the θ axis 241 and the broken lines 246 to 249 are separated from one another at even interval θ with multiple of the natural number of Δρ(θ). There is no broken line in θ=0 in which the line goes securely through a top of the plot while the line does not exceed the value range of X.

A vote $H(\theta 0)$ of a certain $\theta 0$ is computed as the sum of the votes on the θ axis 241 and the votes on the broken lines 242 to 249, i.e. $H(\theta 0)=\Sigma\{S(\theta 0, a\Delta\rho(\theta 0))\}$, when longitudinally viewed at the position of $\theta=\theta 0$. This operation corresponds to the sum of the votes of the reference line 200 in $\theta=\theta 0$ and the vote of the cyclic extension line. The numeral 250 represents a bar graph of the vote distribution H(θ). Unlike the bar graph shown by the numeral 222 of FIG. 18, in the vote distribution H(θ) of the numeral 250, even if the absolute value of θ is increased, the vote is not decreased. This is because the addition of the cyclic extension line to the vote computation allows the use of the same frequency band for all θ. The ten maximum positions shown by the numeral 251 of FIG. 19 are detected from the vote distribution 250. Among the ten maximum positions, the maximum position 252 and 253 obtain a vote not lower than the threshold to detect the line group (reference line 254 and cyclic extension line 255 corresponding to the maximum position 253) in which the voice is detected from about 20 degrees leftward relative to the front face of the pair of microphones and the line group (reference line 256 and cyclic extension lines 257 and 258 corresponding to the maximum position 252) in which the voice is detected from about 45 degrees rightward relative to the front face of the pair of microphones. Thus, the lines from the small-angle line to the large-angle line can stably be detected by summing the vote values of some points separated from one another by Δρ to search for the maximum position

[Generalization: Maximum Position Detection in Consideration of Non-In-Phase]

When the acoustic signal input unit 2 performs analog-to digital conversion of the signals of the microphone 1*a* and the microphone 1*b* in phase, the line to be detected does not pass through ρ=0, i.e. the origin of the XY coordinate system. In this case, it is necessary that the limitation of ρ=0 is removed to search for the maximum position.

When the reference line in which the limitation of ρ=0 is removed is generalized to describe (θ0, ρ0), the line group (reference line and cyclic extension line) can be described as (θ0, aΔρ(θ0)+ρ0), where Δρ(θ0) is an average movement amount of the cyclic extension line determined by θ0. When the sound source comes from a certain direction, only one of the most promising line group exists in θ0 corresponding to the direction. The line group is given by (θ0, aΔρ(θ0)+ρ0max) using a value of ρ0max in which the vote of the line group Σ{S(θ0, aΔρ(θ0)+ρ0)} becomes the maximum when ρ0 is changed. Therefore, the vote V is set at the maximum vote value Σ{S(θ, aΔρ(θ)+ρ0max)} in each θ, which allows the same maximum position detection algorithm as for the limitation of ρ=0 to be applied to perform the line detection.

[Graphics Matching Unit 6]

The detected line group is a candidate of the sound source at each time, and the candidate of the sound source is independently estimated in each pair of microphones. At this point, the voice emitted from the same sound source is simultaneously detected as each line group by plural pairs of microphones. Therefore, when correspondence of the line group which derives from the same sound source can be performed by the plural pairs of microphones, the information on the sound source can be obtained with higher reliability. The graphics matching unit 6 performs the correspondence. The information edited in each line group by the graphics matching unit 6 is referred to as sound source candidate information.

Figure 20:
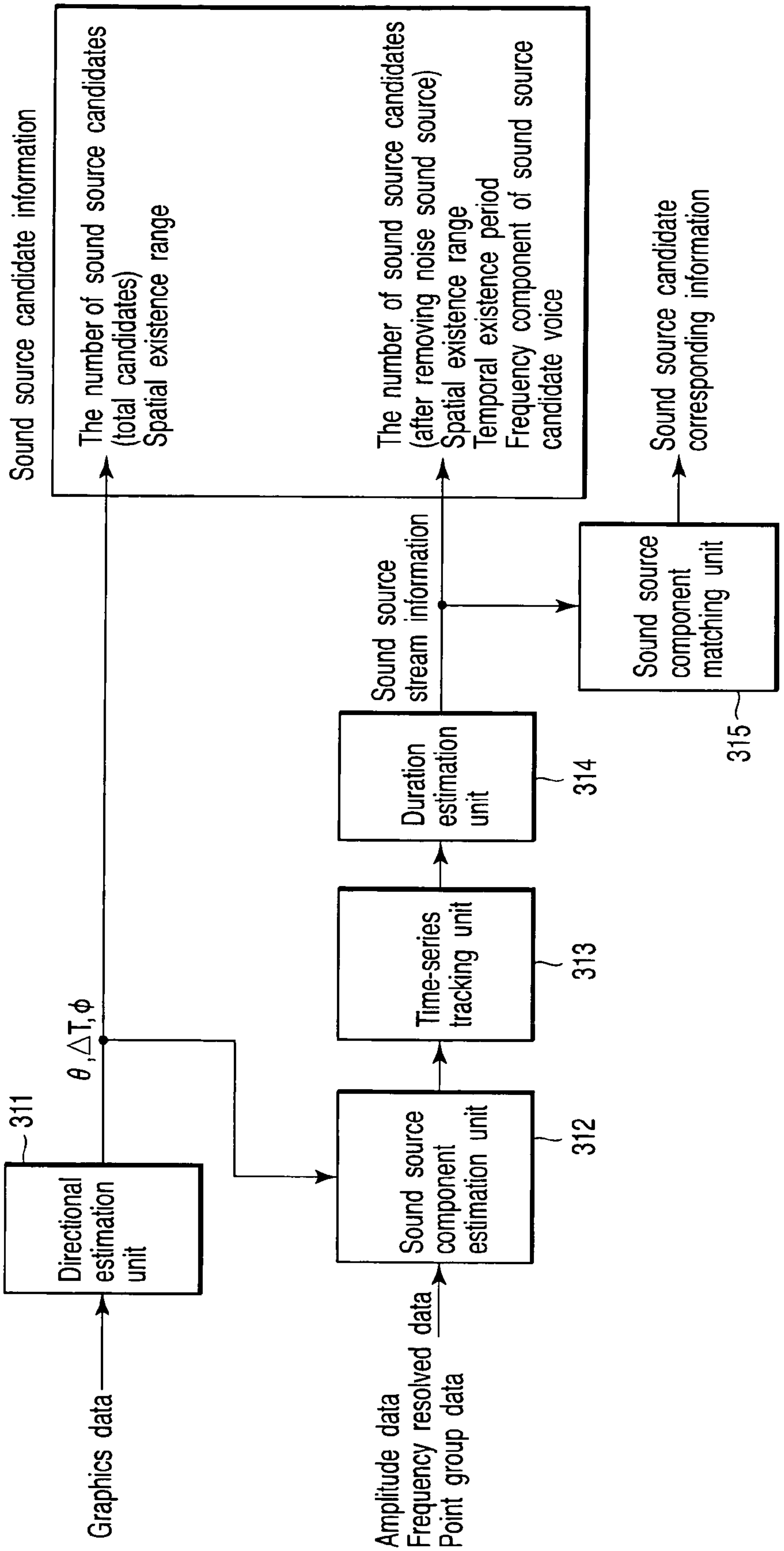
FIG. 20 is a block diagram showing the internal configuration of a graphics matching unit.

As shown in FIG. 20, the graphics matching unit 6 includes a directional estimation unit 311, a sound source component estimation unit 312, a time-series tracking unit 313, a duration estimation unit 314, and a sound source component matching unit 315.

[Directional estimation Unit 311]

Figure 21:
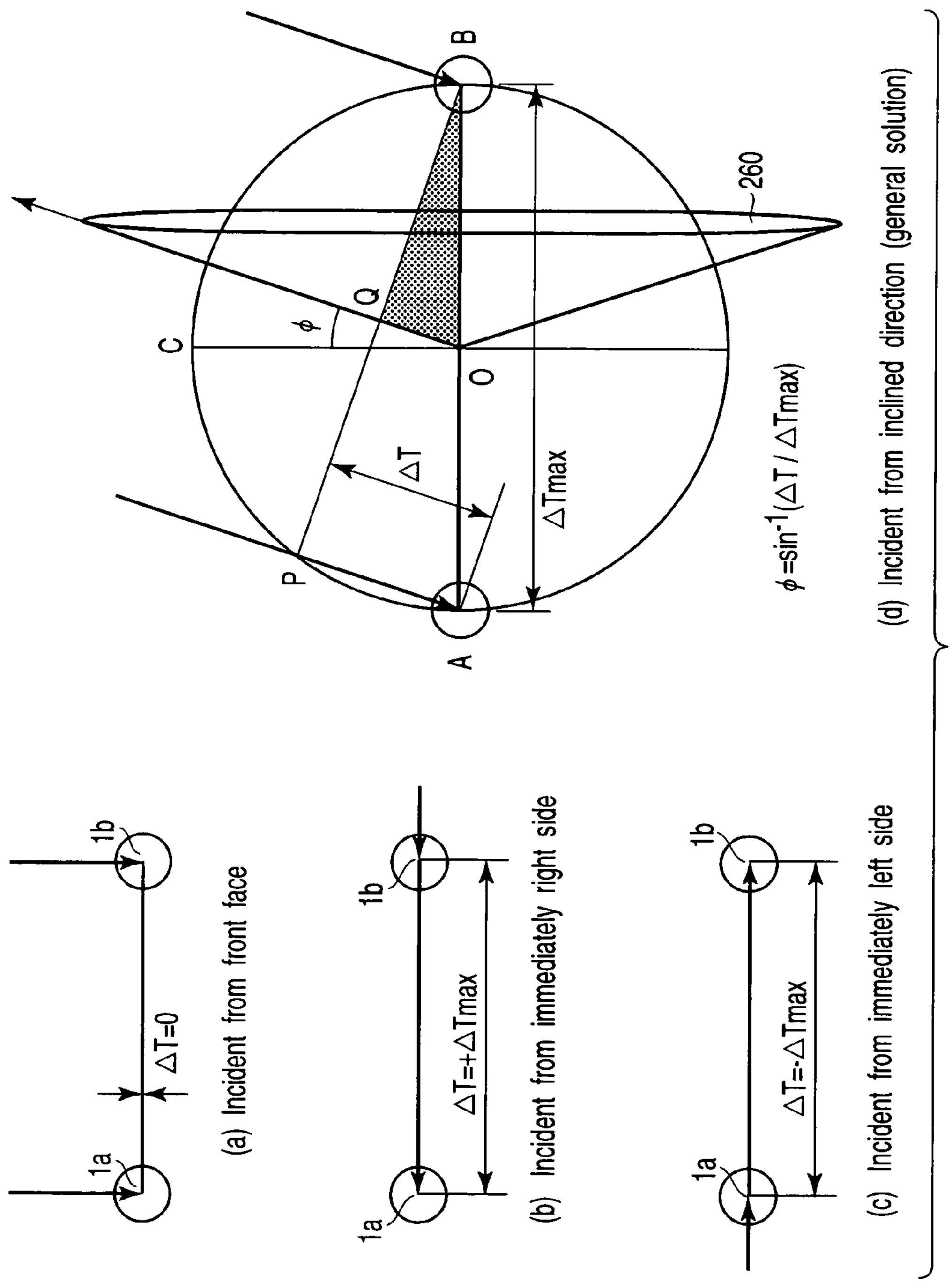
FIG. 21 is view for explaining directional estimation.

The directional estimation unit 311 receives the line detection result from the straight-line detection unit 304, i.e. the θ value of each line group, and the directional estimation unit 311 computes an existence range of the sound source corresponding to each line group. At this point, the number of detected line groups becomes the number of candidates of the sound source. When the distance between the base line and the sound source is sufficiently large with respect to the base line of the pair of microphones, the existence range of the sound source becomes a conical surface having an angle with respect to the base line of the pair of microphones. Referring to FIG. 21, the existence range will be described below.

The arrival time difference ΔT between the microphone 1*a* and the microphone 1*b* can be changed within the range of ±ΔTmax. As shown in FIG. 21A, when the acoustic signal is incident from the front face, ΔT becomes zero, and an azimuth Φ of the sound source becomes 0° based on the front face. As shown in FIG. 21B, when the voice is incident from the immediately right side, i.e. from the direction of the microphone 1*b*, ΔT is equal to +ΔTmax, and the azimuth Φ of the sound source becomes +90° when the clockwise direction is set at positive based on the front face. Similarly, as shown in FIG. 21C, when the voice is incident from the immediately left side, i.e. from the direction of the microphone 1*a*, ΔT is equal to −ΔTmax, and the azimuth Φ becomes −90°. Thus, ΔT is defined such that ΔT is set at a positive value when the sound is incident from the rightward direction and ΔT is set at the negative value when the sound is incident from the leftward direction.

Next, a general condition shown in FIG. 21D will be described. Assuming that the position of the microphone 1*a* is A, the position of the microphone 1*b* is B, and the voice is incident from the direction of a line segment PA, a triangle PAB becomes a right-angled triangle whose vertex P has a right angle. At this point, the center between the microphones is set at O, a line segment OC is set at the front face direction of the pair of microphones, the direction OC is set at the azimuth of 0°, and an angle is defined as the azimuth Φ when the angle is set at a positive value counterclockwise. A triangle QOB is similar to the triangle PAB, so that the absolute value of the azimuth Φ is equal to an angle OBQ, i.e. an angle ABP, and a sign coincides with the sign of ΔT. The angle ABP can be computed as $\sin^{-1}$ of a ratio of the line segments PA and AB. When the length of the line segment PA is expressed by ΔT corresponding to the line segment PA, the length of the line segment AB corresponds to ΔTmax. Therefore, the azimuth can be computed as $\Phi=\sin^{-1}(\Delta T/\Delta T\max)$ including the sign. The existence range of the sound source is estimated as a conical surface 260. In the conical surface 260, the vertex is the point O, the axis is the base line AB, and the angle of the cone is (90−Φ)°. The sound source exists on the conical surface 260.

Figure 22:
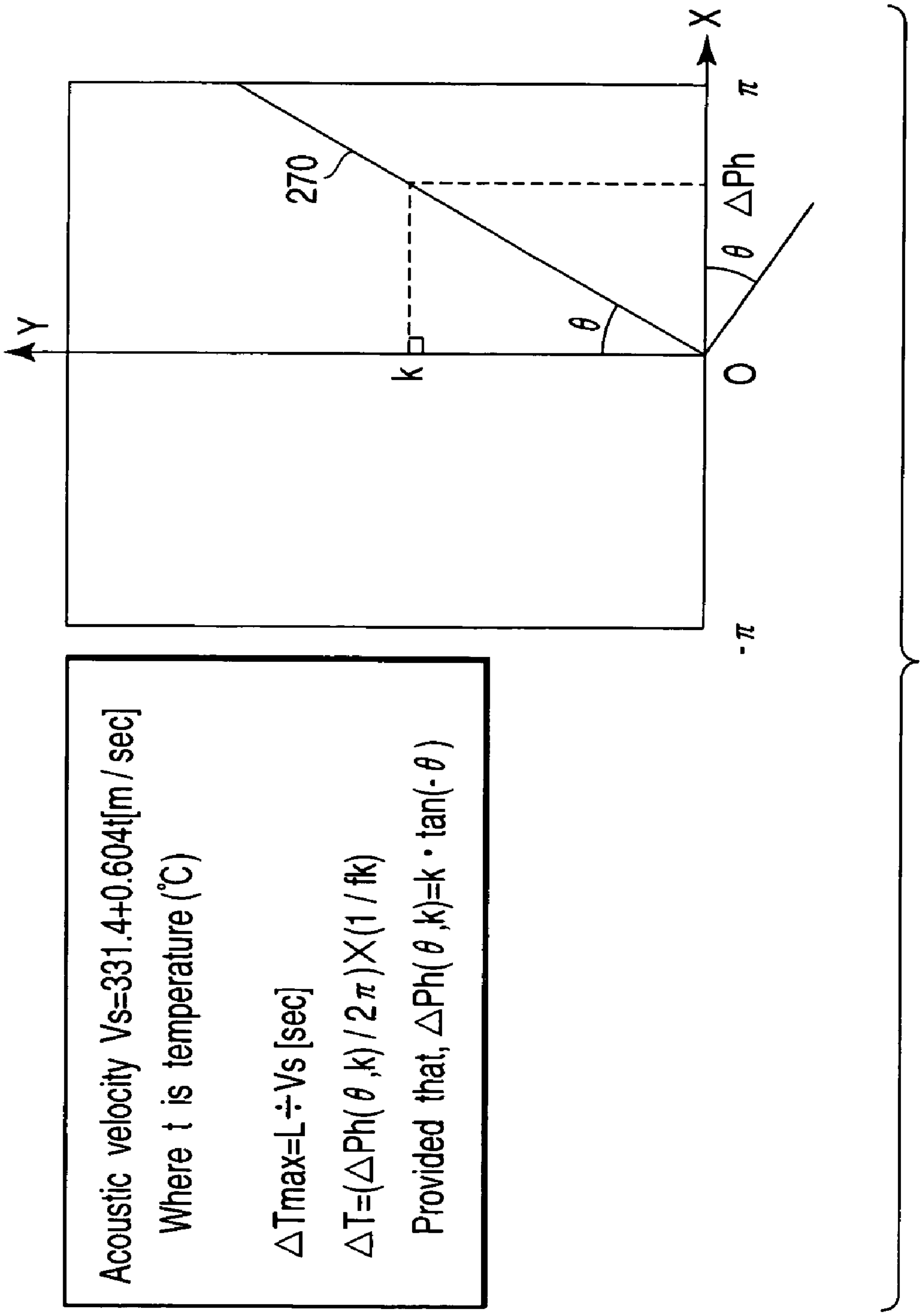
FIG. 22 is a view showing the relationship between θ and ΔT.

As shown in FIG. 22, ΔTmax is a value in which distance between microphones L (m) is divided by acoustic velocity Vs (m/sec). In this case, it is known that the acoustic velocity Vs can be approximated as a function of temperature t (° C.). It is assumed that a line 270 is detected with the gradient θ of Hough by the straight-line detection unit 304. Since the line 270 is inclined rightward, θ has a negative value. In the case of y=k (frequency fk), the phase difference ΔPh shown by the line 270 can be determined as the function of k and θ by k·tan (−θ). At this point, ΔT becomes the time in which one period 1/fk (sec) of the frequency fk is multiplied by a ratio of the phase difference ΔPh(θ, k) to 2π. Since θ is a signed quantity, ΔT is also a signed quantity. Namely, when the sound is incident from the right side in FIG. 21D (the phase difference ΔPh becomes the positive value), θ becomes a negative value. When the sound is incident from the left side in FIG. 21D (the phase difference ΔPh becomes a negative value), θ becomes a positive value. Therefore the sign of θ is inversed. The actual computation may be performed with k=1 (frequency immediately above the direct-current component k=0).

[Sound Source Component Estimation Unit 312]

The sound source component estimation unit 312 evaluates the distance between the (x, y) coordinate value of each frequency component given by the coordinate value determining unit 302 and the line detected by the straight-line detection unit 304, and the sound source component estimation unit 312 detects the points (i.e. frequency component) located near the line as the frequency component of the line group (i.e. sound source). Then, the sound source component estimation unit 312 estimates the frequency component in each sound source based on the detection result.

[Detection by Distance Threshold Method]

Figure 23A:
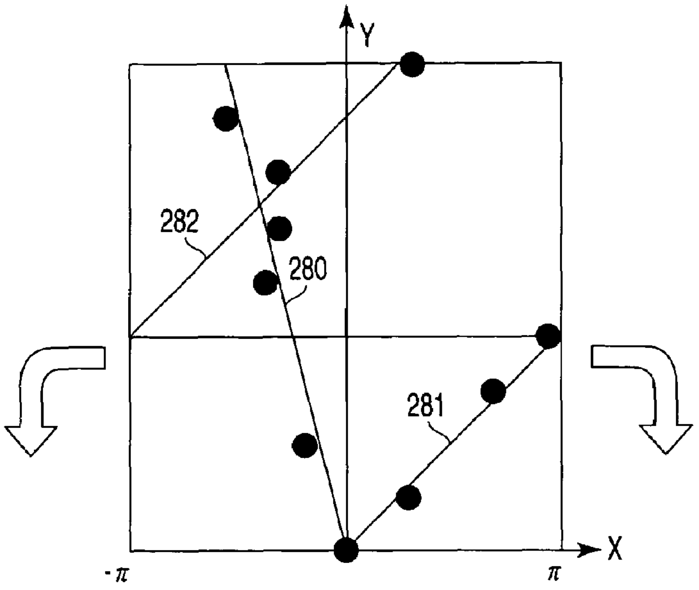
FIGS. 23A to 23C are views for explaining sound source component estimation (distance threshold method) when the plural sound sources exist.

FIG. 23 schematically shows a principle of sound source component estimation when plural sound sources exist. FIG. 23A is a frequency-phase difference plot like that of FIG. 9, and FIG. 23A shows the case in which two sound sources exist in the different directions with respect to the pair of microphones. In FIG. 23, the numeral 280 forms one line group, and the numerals 281 and 282 form another line group. The dot represents the position of the phase difference in each frequency component.

Figure 23B:
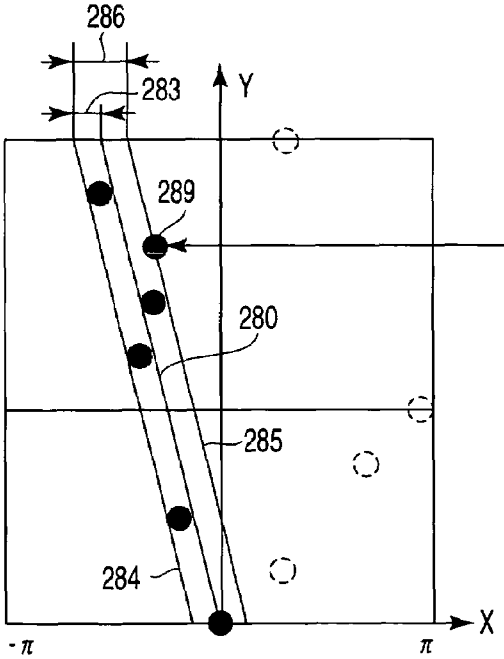

As shown in FIG. 23B, the frequency component forming the source sound corresponding to the line group 280 is detected as the frequency component (dot in FIG. 23) located within an area 286 which is squeezed between lines 284 and 285. The lines 284 and 285 are horizontally separated from the line 280 by a horizontal distance 283. The detection of a certain frequency component as the component of a certain line is referred to as belonging of frequency component to line.

Figure 23C:
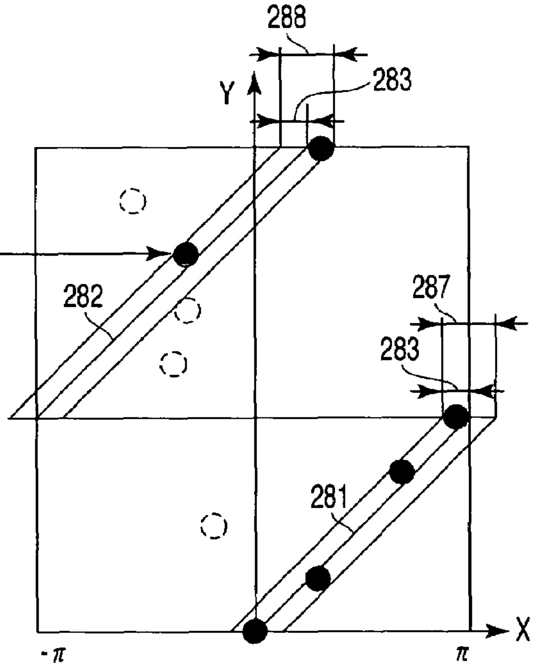

Similarly, as shown in FIG. 23C, the frequency component forming the source sound corresponding to the line group 281 and 282 is detected as the frequency component (dot in FIG. 23) located within areas 287 and 288 which are squeezed between lines. The lines are horizontally separated from the lines 281 and 282 by a horizontal distance 283 respectively.

At this point, the frequency component 289 and the origin (direct-current component) are included in both the areas 286 and 288, so that the frequency component 289 and the origin are double detected as the component of both the sound sources (multiple belonging). The method, in which the threshold processing is performed to the horizontal distance between the frequency component and the line, the frequency component existing in the threshold is selected in each line group (sound source), and the power and the phase of the frequency component are directly set at the source sound component, is referred to as the "distance threshold method."

[Detection by Nearest Neighbor Method]

Figure 24:
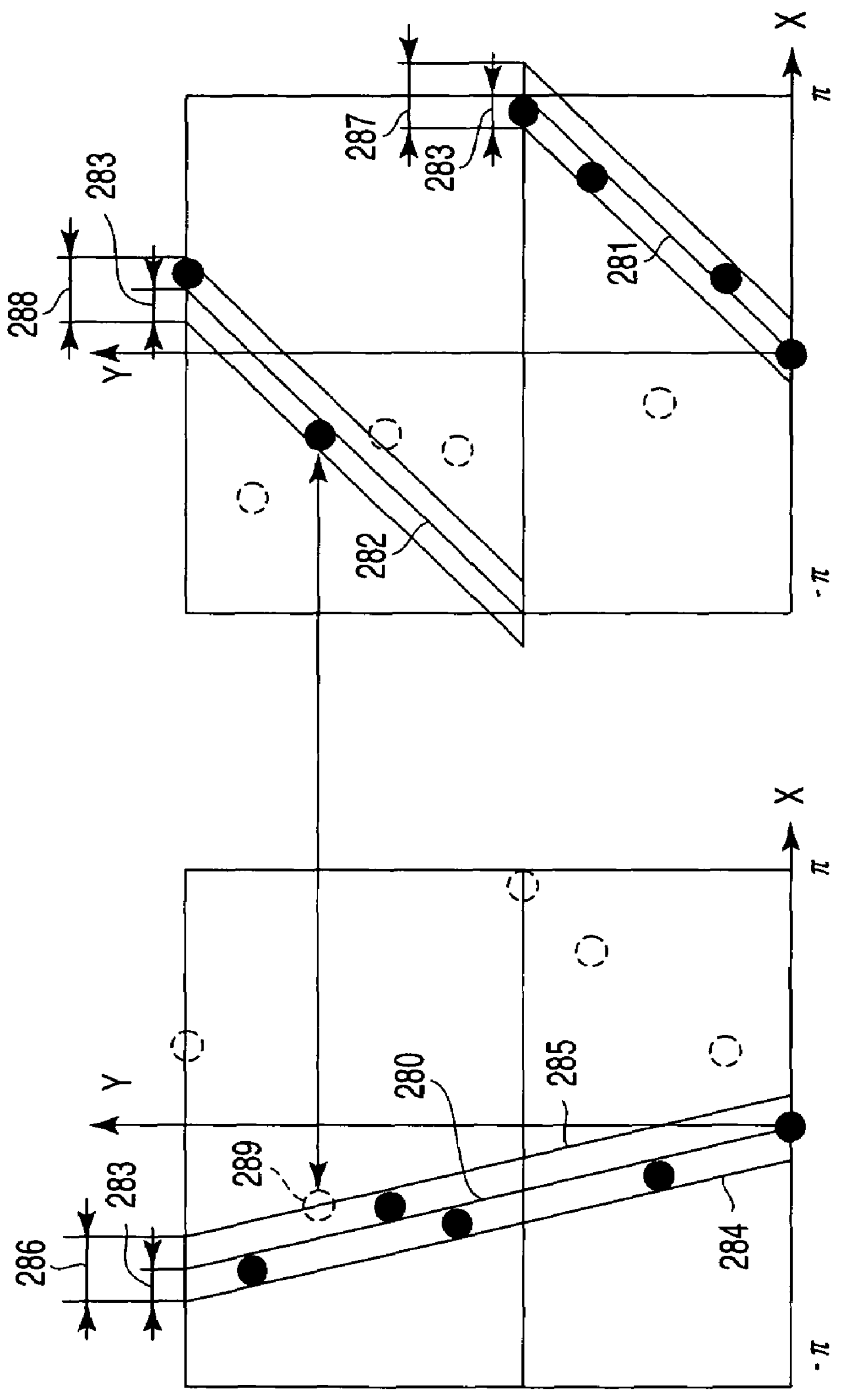
FIG. 24 is a view for explaining a nearest neighbor method.

FIG. 24 shows the result in which the frequency component 289 which belongs multiply to the line groups in FIG. 23 is caused to belong to only the nearest line group. As a result of comparison of the horizontal distances between the frequency component 289 and the lines 280 and 282, it is found that the frequency component 289 is nearest to the line 282. At this point, the frequency component 289 exists in the area 288 near the line 282. Therefore, the frequency component 289 is detected as the component belonging to the line group 281 and 282 as shown in FIG. 24. The method, in which the nearest line (sound source) is selected in terms of the horizontal distance in each frequency component and the power and the phase of the frequency component are directly set at the source sound component when the horizontal distance exists within the predetermined threshold, is referred to as the "nearest neighbor method." The direct-current component (origin) is given special treatment, and the direct-current component is caused to belong to both the line groups (sound sources).

[Detection by Distance Coefficient Method]

In the above two methods, only the frequency component existing within the predetermined threshold of the horizontal distance is selected for the lines constituting the line group, and the power and the phase of the frequency component are directly set at the frequency component of the source sound corresponding to the line group. On the other hand, in the "distance coefficient method" described below, a non-negative coefficient $\alpha$ is computed, and the power of the frequency component is multiplied by the non-negative coefficient $\alpha$. The non-negative coefficient $\alpha$ is monotonously decreased according to the increase in horizontal distance d between the frequency component and the line. Therefore, the frequency component belongs to the source sound while the power of the frequency component is decreased as the frequency component is separated from the line in terms of the horizontal distance.

Figure 25:
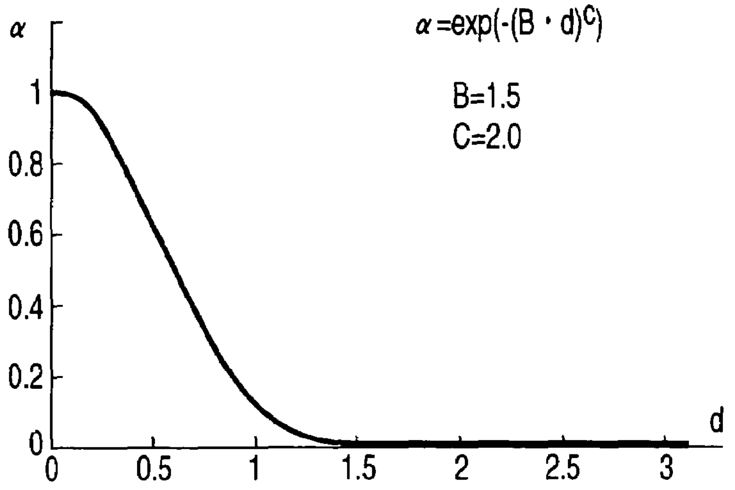
FIG. 25 is a view showing an example of the computing formula for a coefficient α and a graph of the coefficient α.

In this method, it is not necessary to perform threshold processing using the horizontal distance. Each horizontal distance d between the frequency component and a certain line group (horizontal distance between the frequency component and the nearest line in the line group) is determined, and the value in which the power of the frequency component is multiplied by the coefficient $\alpha$ determined based on the horizontal distance d is set at the power of the frequency component in the line group. The equation for computing the non-negative coefficient $\alpha$ which is monotonously decreased according to the increase in horizontal distance d can arbitrarily be set. A sigmoid (S-shaped curve) function $\alpha=\exp((-(B\cdot d)^c)$ shown in FIG. 25 can be cited as an example of the equation for computing the non-negative coefficient $\alpha$. As shown in FIG. 25, assuming that B is a positive value (1.5 in FIG. 25) and c is a value larger than 1 (2.0 in FIG. 25), $\alpha=1$ in the case of $d=0$. $\alpha\rightarrow 1$ in the case of $d\rightarrow\infty$. When a degree of the decrease in non-negative coefficient $\alpha$ is rapid, i.e. when B is large, the component which runs off from the line group is easy to remove, so that the directivity for the sound source direction becomes sharp. On the contrary, when the degree of the decrease in non-negative coefficient $\alpha$ is slow, i.e. when B is small, the directivity becomes dull.

[Treatment of Plural FFT Results]

As described above, not only the voting unit 303 can perform the voting in each one-time FFT, but also the voting unit 303 can perform the voting of the successive m-time FFT results in a collective manner. Accordingly, the functional blocks subsequent to the straight-line detection unit 304 for processing the Hough voting result are operated as a unit of the period in which one-time Hough transform is executed. When the Hough voting is performed in $m\geqq 2$, since the FFT results of the plural times are classified into the components constituting the source sound, sometimes the same frequency components having different times belong to different source sounds. Therefore, irrespective of the value of m, the coordinate value determining unit 302 imparts a starting time of the obtained frame as the information on the obtained time to each frequency component (i.e. dot shown in FIG. 24), and which frequency component of the time belongs to which sound source can be referred to. Namely, the source sound is separated and extracted as time-series data of the frequency component.

[Power Retention Option]

In the above methods, in the frequency component belonging to the plural (N) line groups (sound sources) (only the direct-current component in the nearest neighbor method, and all the frequency components in the distance coefficient method), it is also possible that the powers of the frequency components at the same time which are distributed to the sound sources is normalized and divided into N pieces such that the total of the powers is equal to the power value Po(fk) of the time before the distribution. Therefore, the total power can be retained at the same level as the input power in the whole of the sound source in each frequency component. This is referred to as the "power retention option." There are two distribution methods. Namely, the two methods include (1), where the power is equally divided into N segments (applicable to the distance threshold method and the nearest neighbor method), and (2), where the power is distributed according to the distance between the frequency component and each line group (applicable to the distance threshold method and the distance coefficient method).

The method (1) is the distribution method in which normalization is automatically achieved by equally dividing the power into N segments. The method (1) can be applied to the distance threshold method and the nearest neighbor method, in which the distribution is determined independently of the distance.

The method (2) is the distribution method in which, after the coefficient is determined in the same manner as the distance coefficient method, the total of the powers is retained by normalizing the power such that the total of the powers becomes 1. The method (2) can be applied to the distance threshold method and the distance coefficient method, in which the multiple belonging is generated except in the origin.

The sound source component estimation unit 312 can perform all of the distance threshold method, the nearest neighbor method, and the distance coefficient method according to the setting. Further, in the distance threshold method and the nearest neighbor method, the above-described power retention option can be selected.

[Time-Series Tracking Unit 313]

As described above, the straight-line detection unit 304 determines the line group in each Hough voting performed by the voting unit 303. The Hough voting is performed for the successive m-time ($m \geqq 1$) FFT results in the collective manner. As a result, the line group is determined in time series while the time of m frames is set at one period (hereinafter referred to as "graphics detection period"). Because θ of the line group corresponds to the sound source direction Φ computed by the directional estimation unit 311 in a one-to-one relationship, even if the sound source stands still or is moved, the locus of θ (or Φ) corresponding to the stable sound source should continue on the time axis. On the other hand, due to the threshold setting, sometimes the line group corresponding to the background noise (referred to as "noise line group") is included in the line groups detected by the straight-line detection unit 304. However, the locus of θ (or Φ) of the noise line group does not continue on the time axis, or the locus of θ (or Φ) of the noise line group is short even if the locus continues.

The time-series tracking unit 313 determines the locus of Φ on the time axis by dividing Φ determined in each graphics detection period into continuous groups on the time axis. The grouping method will be described below with reference to FIG. 26.

(1) A locus data buffer is prepared. The locus data buffer is an array of pieces of locus data. A starting time Ts, an end time Te, an array (line group list) of pieces of line group data Ld constituting the locus, and a label number Ln can be stored in one piece of locus data Kd. One piece of line group data Ld is a group of pieces of data including the θvalue and ρ value (obtained by the straight-line detection unit 304) of one line group constituting the locus, the Φ value (obtained by the directional estimation unit 311) indicating the sound source direction corresponding to the line group, the frequency component (obtained by the sound source component estimation unit 312) corresponding to the line group, and the times when these values are obtained. Initially the locus data buffer is empty. A new label number is prepared as a parameter for issuing the label number, and an initial value of the new label number is set at zero.

Figure 26:
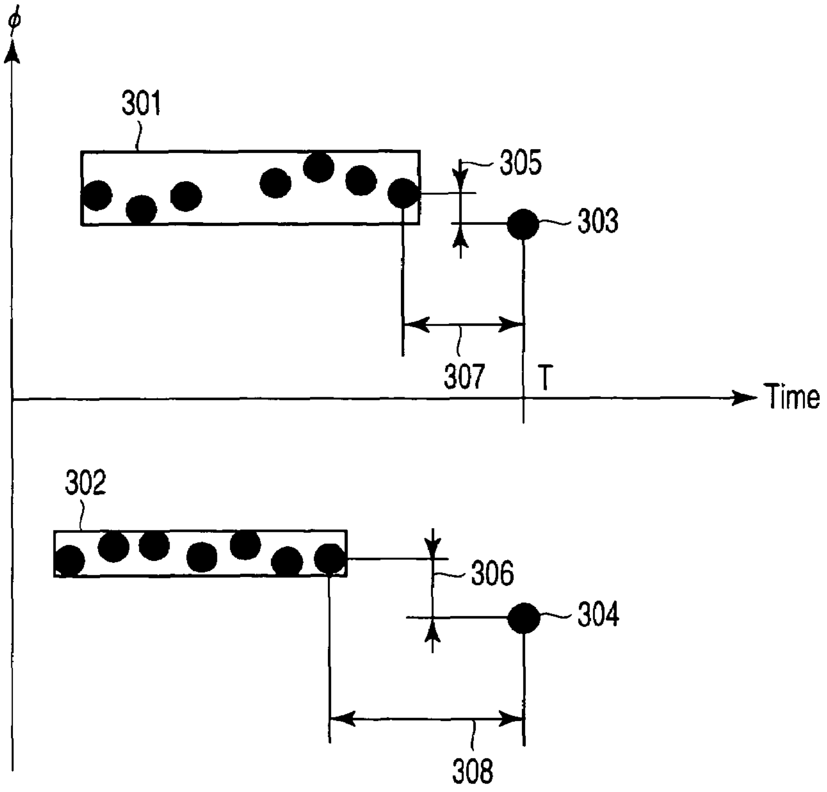
FIG. 26 is a view for explaining Φ tracking on a time axis.

(2) For each Φ which is newly obtained at a time T (hereinafter it is assumed that two Φs shown by dots 303 and 304 in FIG. 26 are obtained as Φn), the pieces of line group data Ld (dots arranged in rectangles in FIG. 26) in the two pieces of locus data Kd 301 and 302 stored in the locus data buffer are referred to, and the locus data having the line group data Ld, in which the difference between the Φ value and Φn (305 and 306 in FIG. 26) exists within a predetermined angular threshold ΔΦ and the difference between the obtained times of the Φ value and Φn (307 and 308 in FIG. 26) existing within a predetermined time threshold Δt, is detected. Accordingly, even the nearest locus data 302 does not satisfy the above condition for the dot 304 while the locus data 301 is detected for the dot 303.

(3) When the locus data satisfying the condition (2) is found like the dot 303, assuming that Φn forms the same locus, Φn, the θ value and ρ value corresponding to Φn, the frequency component, and the current time T are added as new line group data of the locus data Kd to the line group list, and the current time T is set at the new end time Te of the locus. At this point, when plural loci are found, assuming that all the loci form the same locus, all the loci are integrated to the locus data having the youngest label number, and the remaining data is deleted from the locus data buffer. The starting time Ts of the integrated locus data is the earliest starting time among the pieces of locus data before the integration, the end time Te is the latest end time among the pieces of locus data before the integration, and the line group list is the sum of the line group lists of pieces of data before the integration. As a result, the dot 303 is added to the locus data 301.

(4) When the locus data satisfying the condition (2) is not found like the dot 304, the new locus data is produced as the start of the new locus in an empty part of the locus data buffer, both the starting time Ts and the end time Te are set at the current time T, Φn, the θ value and ρ value corresponding to Φn, the frequency component, and the current time T are set at the initial line group data of the line group list, the value of the new label number is given as the label number Ln of the locus, and the new label number is incremented by 1. When the new label number reaches a predetermined maximum value, the new label number is returned to zero. Accordingly, the dot 304 is entered as the new locus data in locus data buffer.

(5) When the locus data which elapses the predetermined time At since the data is finally updated (i.e. from the end time Te) exists in the pieces of locus data stored in the locus data buffer, the locus data which elapses the predetermined time Δt is outputted to the next-stage duration estimation unit 314 as the locus in which a new Φn to be added is not found, i.e. the tracking is completed. Then, the locus data is deleted from the locus data buffer. In FIG. 26, the locus data 302 corresponds to the locus data that elapses the predetermined time Δt.

[Duration Estimation Unit 314]

The duration estimation unit 314 computes duration of the locus from the starting time and the end time of the locus data in which the tracking is completed, and the locus data is outputted from the time-series tracking unit 313. The duration estimation unit 314 certifies the locus data having the duration exceeding the predetermined threshold as the locus data based on the source sound, and the duration estimation unit 314 certifies the pieces of locus data except for the locus data having the duration exceeding the predetermined threshold as the locus data based on the noise. The locus data based on the source sound is referred to as sound source stream information. The sound source stream information includes the starting time Ts and the end time Te of the source sound and the pieces of time-series locus data of θ, ρ, and Φ indicating the sound source direction. The number of line groups obtained by the graphics detection unit 5 gives the number of sound sources, and the noise sound source is also included in the number of sound sources. The number of pieces of sound source stream information obtained by the duration estimation unit 314 gives the reliable number of sound sources except for the number of sound sources based on the noise.

[Sound Source Component Matching Unit 315]

The sound source component matching unit 315 causes the pieces of sound source stream information which derive from the same sound source to correspond to one another, and then the sound source component matching unit 315 generates sound source candidate corresponding information. The pieces of sound source stream information are obtained with respect to the different pairs of microphones through the time-series tracking unit 313 and the duration estimation unit 314 respectively. The voices emitted from the same sound source at the same time should be similar to one another in the frequency component. Therefore, a degree of similarity is computed by matching patterns of the frequency components between the sound source streams at the same time based on the sound source component at each time in each line group estimated by the sound source component estimation unit 312, and the sound source streams correspond to each other. The sound source streams which correspond to each other have the frequency component patterns which capture the maximum degree of similarity not lower than the predetermined threshold. At this point, however, the pattern matching can be performed in all the ranges of the sound source stream, it is efficient to search the sound source streams in which the total degrees of similarity or the average degree of similarity becomes the maximum not lower than the predetermined threshold by matching the frequency component patterns of the times in the period in which the matched sound source streams exist simultaneously. The times to be matched are set the time when the powers of both the matched sound source streams become values not lower than the predetermined threshold, which allows the matching reliability to be further improved.

It should be noted that the information can be exchanged among the functional blocks of the graphics matching unit 6 through a cable (not shown) if necessary.

[Sound Source Information Generating Unit 7]

Figure 30:
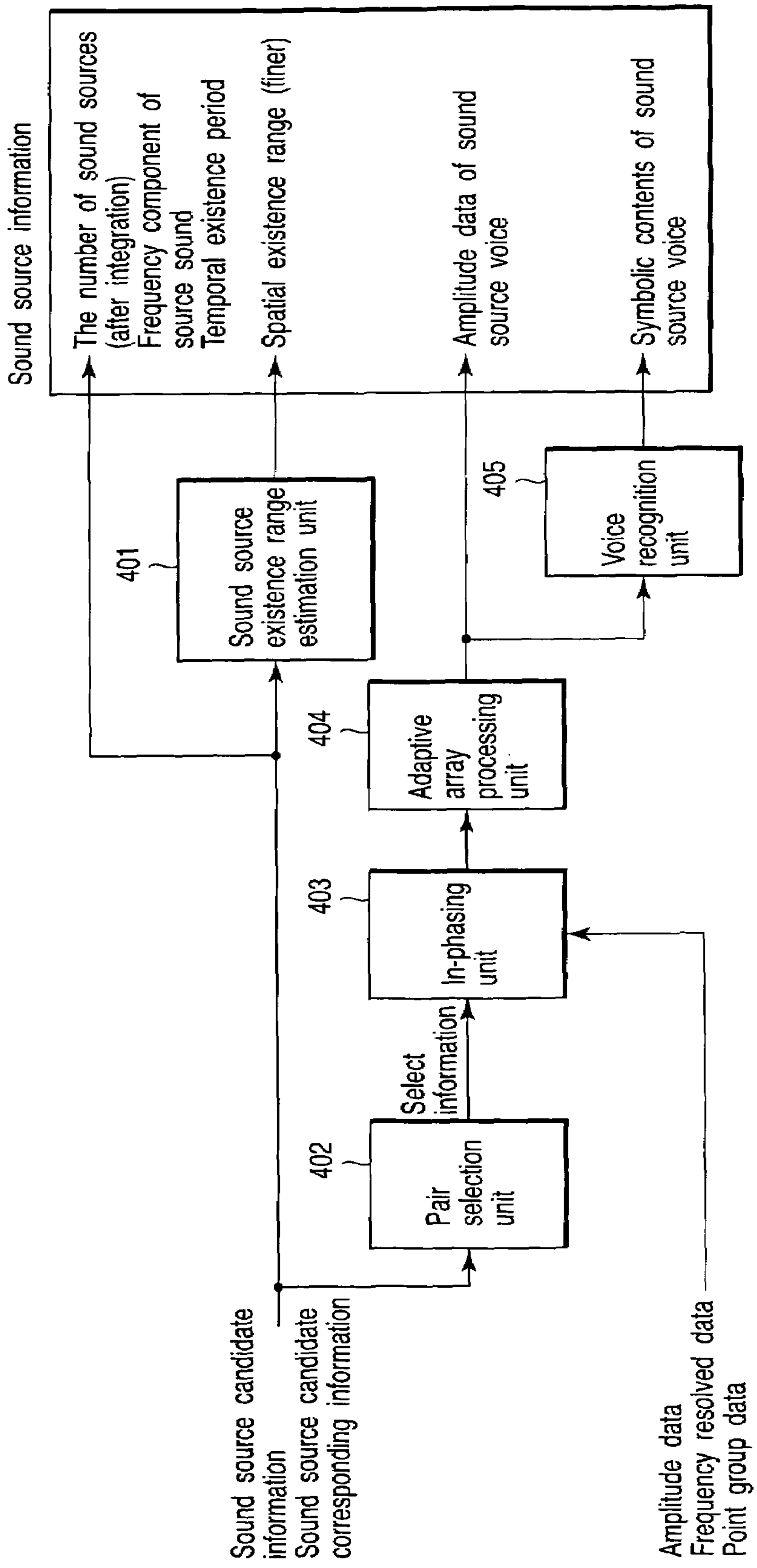
FIG. 30 is a block diagram showing the internal configuration of a sound source generating unit.

As shown in FIG. 30, the sound source information generating unit 7 includes a sound source existence range estimation unit 401, a pair selection unit 402, an in-phasing unit 403, an adaptive array processing unit 404, and a voice recognition unit 405. The sound source information generating unit 7 generates more accurate, more reliable information concerning the sound source from the sound source candidate information in which the correspondence is performed by the graphics matching unit 6.

[Sound Source Existence Range Estimation Unit 401]

The sound source existence range estimation unit 401 computes a spatial existence range of the sound source based on the sound source candidate corresponding information generated by the graphics matching unit 6. The computing method includes the two following methods, and the two methods can be switched by the parameter.

(Computing method 1) The sound source directions indicated by the pieces of sound source stream information, which are caused to correspond to one another because the pieces of sound source stream information which derive from the same sound source, are assumed as the conical surface (see FIG. 21D) in which the midpoint of the pair of microphones detecting the sound source streams is set at the vertex. Neighborhoods of curves or points in which the conical surfaces obtained from all the corresponding sound source streams intersecting one another are computed as the spatial existence range of the sound source.

(Computing method 2) The spatial existence range of the sound source is determined as follows using the sound source directions indicated by the pieces of sound source stream information, which are caused to correspond to one another because the pieces of sound source stream information derive from the same sound source. Namely, (1), a concentric spherical surface whose center is the origin of the apparatus is assumed, and a table in which an angle for each pair of microphones is computed is previously prepared for a discrete point (spatial coordinate) on the concentric spherical surface. (2) The discrete point on the concentric spherical surface, in which the angle for each pair of microphones satisfies the set of sound source directions on the condition of least square error, is searched for, and the position of the point is set at the spatial existence range of the sound source.

[Pair Selection Unit 402]

The pair selection unit 402 selects the optimum pair for the sound source voice separation and extraction based on the sound source candidate corresponding information generated by the graphics matching unit 6. The selection method includes the two following methods, and the two methods can be switched by the parameter.

(Selection method 1) The sound source directions indicated by the pieces of sound source stream information, which are caused to correspond to one another because the pieces of sound source stream information derive from the same sound source, are compared to one another to select the pair of microphones detecting the sound source stream located nearest to the front face. Accordingly, the pair of microphones detecting the sound source stream from the most front face is used to extract the sound source voice.

(Selection method 2) The sound source directions indicated by the pieces of sound source stream information, which are caused to correspond to one another because the pieces of sound source stream information derives from the same sound source, are assumed as the conical surface (see FIG. 21D) in which the midpoint of the pair of microphone detecting the sound source streams is set at the vertex, and the pair of microphones detecting the sound source stream in which the other sound sources are farthest from the conical surface is selected. Accordingly, the pair of microphones which receives the least effect from other sound sources is used to extract the sound source voice.

[In-Phasing Unit 403]

The in-phasing unit 403 obtains time transition in the sound source direction Φ of the stream from the sound source stream information selected by the pair selection unit 402, and the in-phasing unit 403 determines a width $\Phi w=\Phi max-\Phi mid$ by computing an intermediate value $\Phi mid=(\Phi max+\Phi min)/2$ from a maximum value Φmax and a minimum value Φmin of Φ. The in-phasing unit 403 extracts the pieces of time-series data of the two frequency resolved data a and b, which are of the origin of the sound source stream information, from the time going back to the predetermined time from the starting time Ts of the stream, to the time that elapses the predetermined time since the end time Te, and the in-phasing unit 403 performs correction such that the arrival time difference computed back by the intermediate value Φmid is cancelled. Therefore, the in-phasing unit 403 performs in-phasing.

Alternatively, the in-phasing unit 403 sets the sound source direction Φ of each time by the directional estimation unit 311 at Φmid, and the in-phasing unit 403 can simultaneously perform the in-phasing of the pieces of time-series data of the two frequency resolved data a and b. Whether the sound source stream information is referred to, or Φ of each time is referred to is determined by the operation mode, and the operation mode can be set as the parameter.

[Adaptive Array Processing Unit 404]

The adaptive array processing unit 404 separates and extracts the source sound (time-series data of frequency component) of the stream with high accuracy by performing an adaptive array process to the extracted and in-phased pieces of time-series data of the two frequency resolved data a and b. In the adaptive array process, center directivity is faced to the front face of 0° and the value in which a predetermined margin is added to ±Φw is set at a tracking range. As disclosed in Tadashi Amada et al., "Microphone array technique for speech recognition," Toshiba review, vol. 59, No. 9, 2004, the method of clearly separating and extracting the voice within the set directivity range by using main and sub Griffith-Jim type generalized side-lobe cancellers can be used as the adaptive array process.

In the case of the use of the adaptive array process, usually the tracking range is previously set to wait the voice from the direction of the tracking range. Therefore, in order to wait the voice from all directions, it is necessary to prepare many adaptive arrays whose tracking ranges are changed. On the contrary, in the apparatus of the embodiment, after the number of sound sources and the directions of the sound sources are actually determined, only the number of adaptive arrays can be operated according to the number of sound sources, and the tracking range can be set at a predetermined narrow range according to the sound source directions. Therefore, the voice can efficiently be separated and extracted with high quality.

Further, the previous in-phase of the pieces of time-series data of the two frequency resolved data a and b allows the sound from all directions to be processed only by setting the tracking range in the adaptive array process at the neighborhood of the front face.

Voice Recognition Unit 405

The voice recognition unit 405 analyzes and verifies the time-series data of the source sound extracted by the adaptive array processing unit 404. Therefore, the voice recognition unit 405 extracts symbolic contents of the stream, i.e. symbols (string) expressing linguistic meaning, the kind of sound source, or the speaker.

[Output Unit 8]

The output unit 8 outputs information that includes at least one of the number of sound source candidates, the spatial existence range of the sound source candidate (angle Φ determining the conical surface), the voice component configuration (pieces of time-series data of the power and phase in each frequency component), the number of sound source candidates (sound source streams) except for the noise sound sources, and the temporal existence period of the voice as the sound source candidate information by the graphics matching unit 6. The number of sound source candidates can be obtained as the number of line groups by the graphics detection unit 5. The spatial existence range of the sound source candidate, which is of the emitting source of the acoustic signal, is estimated by the directional estimation unit 311. The voice component configuration is estimated by the sound source component estimation unit 312, and the sound source candidate emits the voice. The number of sound source candidates can be obtained by the time-series tracking unit 313 and the duration estimation unit 314. The temporal existence period of the voice can be obtained by the time-series tracking unit 313 and the duration estimation unit 314, and the sound source candidate emits the voice. Alternatively, the output unit 8 outputs the information including at least one of the number of sound sources, the finer spatial existence range of the sound source (conical surface intersecting range or table-searching coordinate value), the separated voice in each sound source (time-series data of amplitude value), and the symbolic content of the sound source voice as the sound source information by the sound source information generating unit 7. The number of sound sources can be obtained as the number of corresponding line group (sound source stream) by the graphics matching unit 6. The finer spatial existence range of the sound source is estimated by the sound source the existence range estimation unit 401, and the sound source is the emitting source of the acoustic signal. The separated voice in each sound source can be obtained by the pair selection unit 402, the in-phasing unit 403, and the adaptive array unit 404. The symbolic content of the sound source voice can be obtained by the voice recognition unit 405.

[User Interface Unit 9]

The user interface unit 9 displays various kinds of setting contents necessary for the acoustic signal processing to a user, and the user interface unit 9 receives the setting input from the user. The user interface unit 9 also stores the setting contents in an external storage device or reads the setting contents from the external storage device. As shown in FIGS. 17 and 19, the user interface unit 9 visualizes and displays the various kinds of processing results and intermediate results of the following items: (1) Display of the frequency component in each microphone, (2) Display of the phase difference (or time difference) plot (i.e. display of two-dimensional data), (3) Display of various vote distributions, (4) Display of the maximum position, and (5) Display of the line group on the plot. Further, as shown in FIGS. 23 and 24, the user interface unit 9 visualizes and displays the various kinds of processing results and intermediate results of the following items: (6) Display of the frequency component belonging to the line group and (7) Display of locus data. The user interface unit 9 prompts the user to select the desired data to finely visualize the selected data. Thus, the user can confirm the operation of the apparatus of the embodiment, the user can adjust so as to perform the desired operation, and the user can use the apparatus of the embodiment in the adjusted state.

[Process Flowchart]

Figure 27:
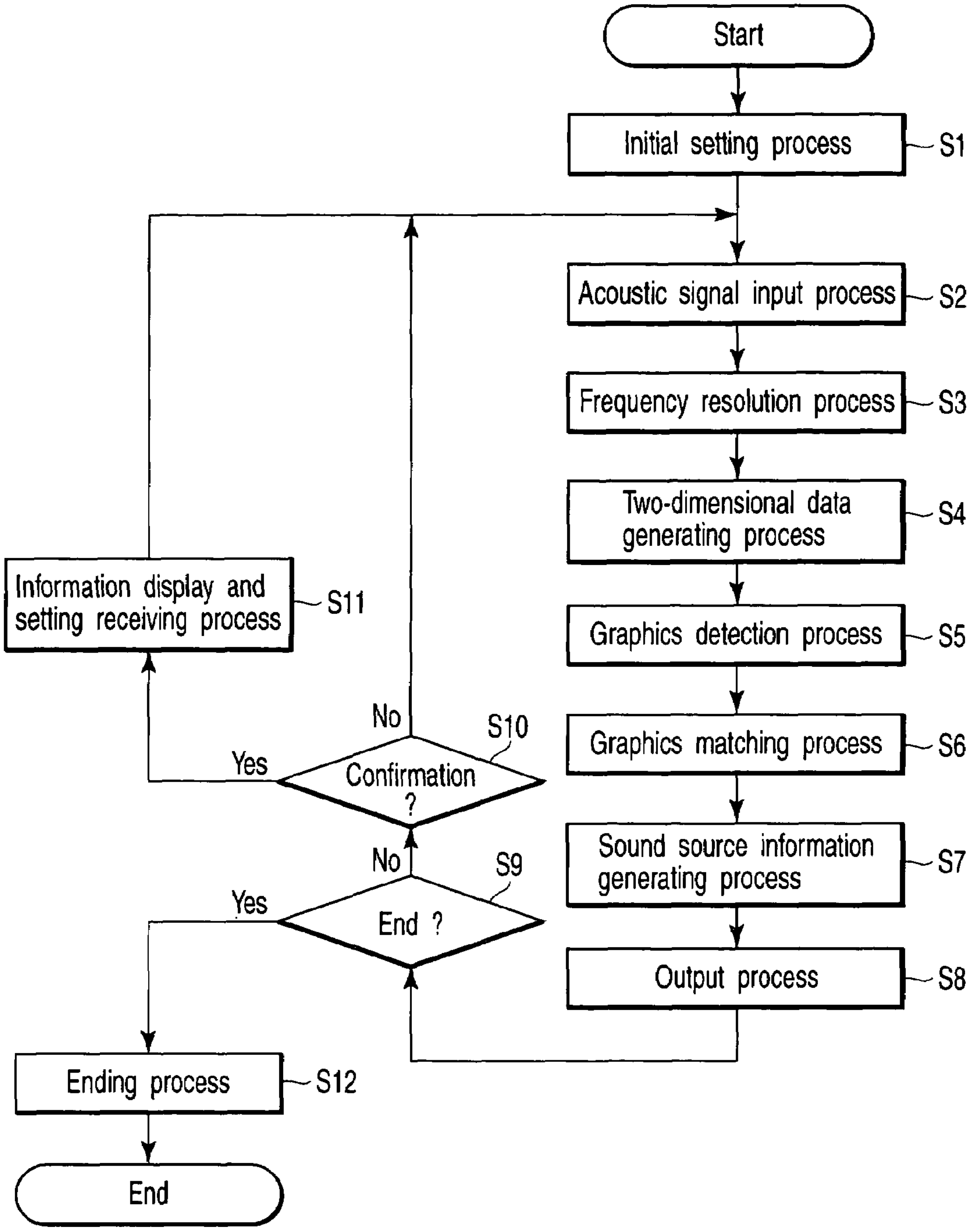
FIG. 27 is a flowchart showing a process performed by the acoustic signal processing apparatus.

FIG. 27 shows a flowchart of the apparatus of the embodiment. The processes carried out in the apparatus of the embodiment include an initial setting process Step S1, an acoustic signal input process Step S2, a frequency resolution process Step S3, a two-dimensional data generating process Step S4, a graphics detection process Step S5, a graphics matching process Step S6, a sound source information generating process Step S7, an output process Step S8, an ending determination process Step S9, a confirming determination process Step S10, an information display and setting receiving process Step S11, and an ending process Step S12.

In initial setting process Step S1, a part of the process in the user interface unit 8 is performed. In Step S1, the various kinds of setting contents necessary for the acoustic signal processing are read from the external storage device, and the apparatus is initialized in a predetermined setting state.

In the acoustic signal input process Step S2, the process in the acoustic signal input unit 2 is performed. The two acoustic signals captured at the two positions which are spatially different from each other are inputted in Step S2.

In the frequency resolution process Step S3, the process in the frequency resolution unit 3 is performed. In Step S3, the frequency resolution is performed on each of the acoustic signals inputted in Step S2, and at least the phase value (and the power value if necessary) is computed for each frequency.

In the two-dimensional data generating process Step S4, the process in the two-dimensional data generating unit 4 is performed. In Step S4, the phase values of the acoustic signals computed in each frequency in Step S3 are compared to one another to compute the phase difference between the phase values in each frequency. Then, the phase difference in each frequency is set as the point on the XY coordinate system, in which the frequency function is set on the X-axis and the phase difference function is set on the Y-axis. The point is converted into the (x, y) coordinate value which is uniquely determined by the frequencies and the phase difference between the frequencies.

In the graphics detection process Step S5, the process in the graphics detection unit 5 is performed. In Step S5, the predetermined graphics is detected from the two-dimensional data by Step S4.

In the graphics matching process Step S6, the process in the graphics matching unit 6 is performed. The graphics detected by Step S5 is set at the sound source candidate, and the graphics is caused to correspond among the pairs of microphones having different sound source candidates. Therefore, the pieces of graphics information (the sound source candidate corresponding information) by the plural pairs of microphones are integrated for the same sound source.

In the sound source information generating process Step S7, the process in the sound source information generating unit 7 is performed. In Step S7, the sound source information including at least one of the number of sound sources which are of the emitting source of the acoustic signal, the finer spatial existence range of the sound source, the component configuration of the voice emitted from each sound source, the separated voice in each sound source, the temporal existence period of the voice emitted from each sound source, and the symbolic contents of the voice emitted from each sound source is generated based on the graphics information (the sound source candidate corresponding information) on the same sound source by the plural pairs of microphones for the same sound source which is integrated in Step S6.

In the output process Step S8, the process in the output unit 8 is performed. The sound source candidate information generated by Step S6 and the sound source information generated by Step S7 are outputted in Step S8.

In the ending determination process Step S9, a part of the process in the user interface unit 9 is performed. In Step S9, whether an ending command from the user is present or absent is confirmed. When the ending command exists, the process flow is controlled to go to Step S12. When the ending command does not exist, the process flow is controlled to go to Step S10.

In the confirming determination process Step S10, a part of the process in the user interface unit 9 is performed. In Step S10, whether a confirmation command from the user is present or absent is confirmed. When the confirmation command exists, the process flow is controlled to go to Step S11. When the confirmation command does not exist, the process flow is controlled to go to Step S2.

In the information display and setting receiving process Step S11, a part of the process in the user interface unit 9 is performed. Step S11 is performed by receiving the confirmation command from the user. Step S11 enables the display of various kinds of setting contents necessary for the acoustic signal processing to the user, the reception of the setting input from the user, the storage of the setting contents in the external storage device by the storage command, the readout of the setting contents from the external storage device by the read command, and the visualization of the various processing results and the intermediate results, and the display of the various processing results and the intermediate results to the user. Further, in Step S11, the user selects the desired data to visualize the data in more detail. Therefore, the user can confirm the operation of the acoustic signal processing, the user can adjust the apparatus such that the apparatus performs the desired operation, and the process can be continued in the adjusted state.

In the ending process Step S12, a part of the process in the user interface unit 9 is performed. Step S12 is performed by receiving the ending command from the user. In Step S12, the various kinds of setting contents necessary for the acoustic signal processing are automatically stored.

[Modification]

The modifications of the above-described embodiment will be described below.

[Detection of Vertical Line]

In the embodiment, the two-dimensional data generating unit 4 generates the point group while the X coordinate value is set at the phase difference $\Delta Ph(fk)$ and the Y coordinate value is set at the frequency component number k by the coordinate value determining unit 302. It is also possible that the X coordinate value is set as an estimation value $\Delta T(fk)=(\Delta Ph(fk)/2\pi)\times(1/fk)$ in each frequency of the arrival time difference computed from the phase difference $\Delta Ph(fk)$. When the arrival time difference is used instead of the phase difference, the points having the same arrival time differences, i.e. the points which derive from the same sound source are arranged on a perpendicular line.

Figure 28A:
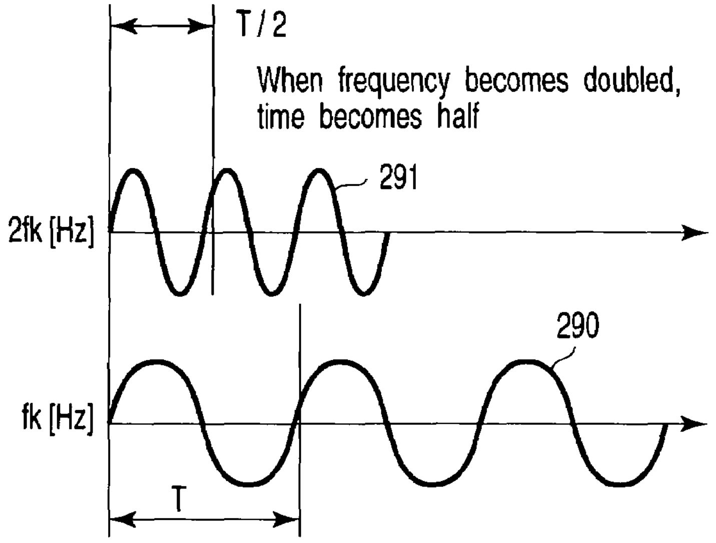
FIGS. 28A and 28B are views showing the relationship between the frequency and an expressible time difference.
Figure 28B:
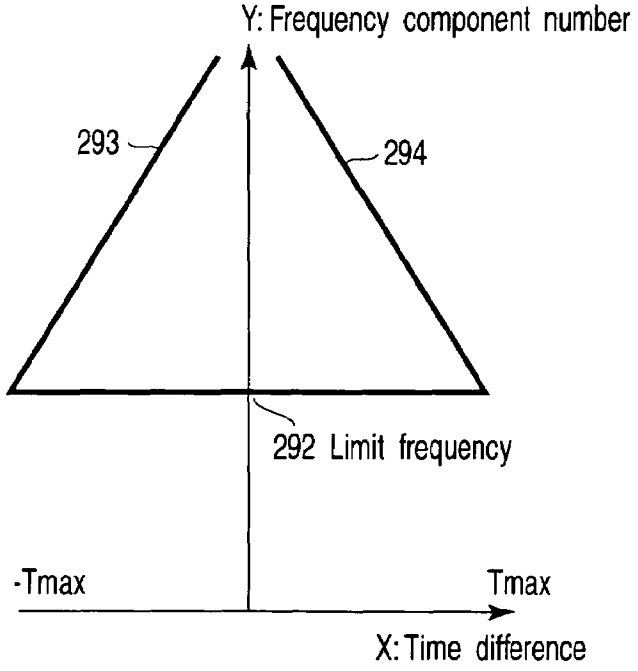

At this point, as the frequency is increased, the time difference $\Delta T(fk)$ which can be expressed by the phase difference $\Delta Ph(fk)$ is decreased. As shown in FIG. 28A, assuming that the time expressed by one period of a wave 290 of the frequency fk is T, the time which can be expressed by one period of a wave 291 of the double frequency 2 fk becomes a half T/2. At this point, when the time difference is set at the X-axis as shown in FIG. 28A, the range is ±Tmax, and the time difference is not observed when exceeding the range. However, in the low frequencies not more than a limit frequency 292 where Tmax is not more than a half period (i.e. $\pi$), the arrival time difference $\Delta T(fk)$ is uniquely determined from the phase difference $\Delta Ph(fk)$. However, in the high frequencies exceeding the limit frequency 292, the computed arrival time difference $\Delta T(fk)$ is smaller than the theoretical Tmax, and the arrival time difference $\Delta T(fk)$ can express only the range narrowed by the lines 293 and 294 as shown in FIG. 28B. This is the same problem as the phase difference cyclic problem.

Figure 29:
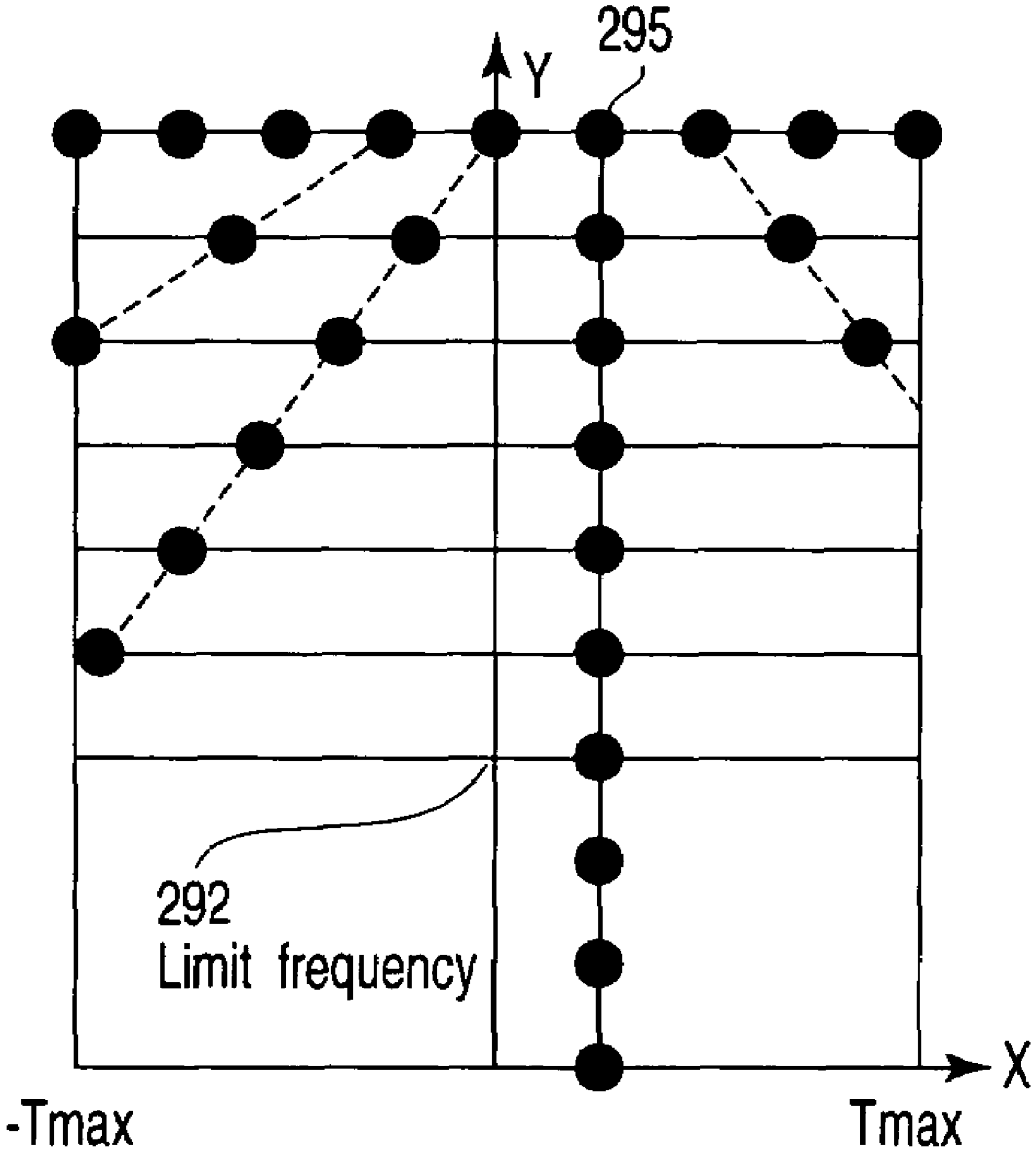
FIG. 29 is a time-difference plot when a redundant point is generated.

Therefore, in order to solve the phase difference cyclic problem, for the frequency ranges exceeding the limit frequency 292, the coordinate value determining unit 302 forms the two-dimensional data by generating the redundant points at the position of the arrival time difference ΔT(fk) corresponding to the phase difference within the range of ±Tmax as shown in FIG. 29. The redundant points are generated by adding 2π, 4π, 6π, and the like to or by subtracting 2π, 4π, 6π, and the like from the phase difference ΔPh(fk). The generated point group is indicated by the dots, and the plural dots are plotted for one frequency in the frequency ranges exceeding the limit frequency 292.

Accordingly, the voting unit 303 and the straight-line detection unit 304 can detect a promising perpendicular line (295 in FIG. 29) by Hough voting from the two-dimensional data which is generated as one or plural points for one phase difference. At this point, since the perpendicular line is the line which becomes θ=0 on the Hough voting space, the perpendicular-line detection problem can be solved by detecting the maximum position which obtains the votes not lower than the predetermined threshold at the maximum position on the ρ axis, where θ becomes zero, in the vote distribution after the Hough voting. The ρ value of the detected maximum position gives the intersection point of the perpendicular line and the X-axis, i.e. the estimation value of the arrival time difference ΔT. In the voting, it is possible to directly use the voting conditions and addition methods described in the voting unit 303. The line corresponding to the sound source is not the line group, but the single line.

The problem that the maximum position is determined can also be solved by detecting the maximum position which obtains the votes not lower than the predetermined threshold at the maximum position on the one-dimensional vote distribution (peripheral distribution of the projection voting to the Y-axis direction), in which the X coordinate value of the redundant point group is voted. Thus, all the pieces of evidence indicating the sound source existing in the different directions are projected to the lines having the same gradients (i.e. perpendicular line) by using the arrival time difference as the X-axis instead of the phase difference, so that the detection can simply be performed by the peripheral distribution without performing the Hough transform.

The sound source direction information obtained by determining the perpendicular line is the arrival time difference ΔT(fk) which is obtained not as θ but as ρ. Therefore, the directional estimation unit 311 can immediately compute the sound source direction Φ from the arrival time difference ΔT with no θ.

Thus, the two-dimensional data generated by the two-dimensional data generating unit 4 is not limited to one kind, and the graphics detection method performed by the graphics detection unit 5 is not limited to one method. The point group plot shown in FIG. 29 using the arrival time difference and the detected perpendicular line are also the information display objects of the user interface unit 9 to the user.

[Program: Realization with Computer]

Figure 31:
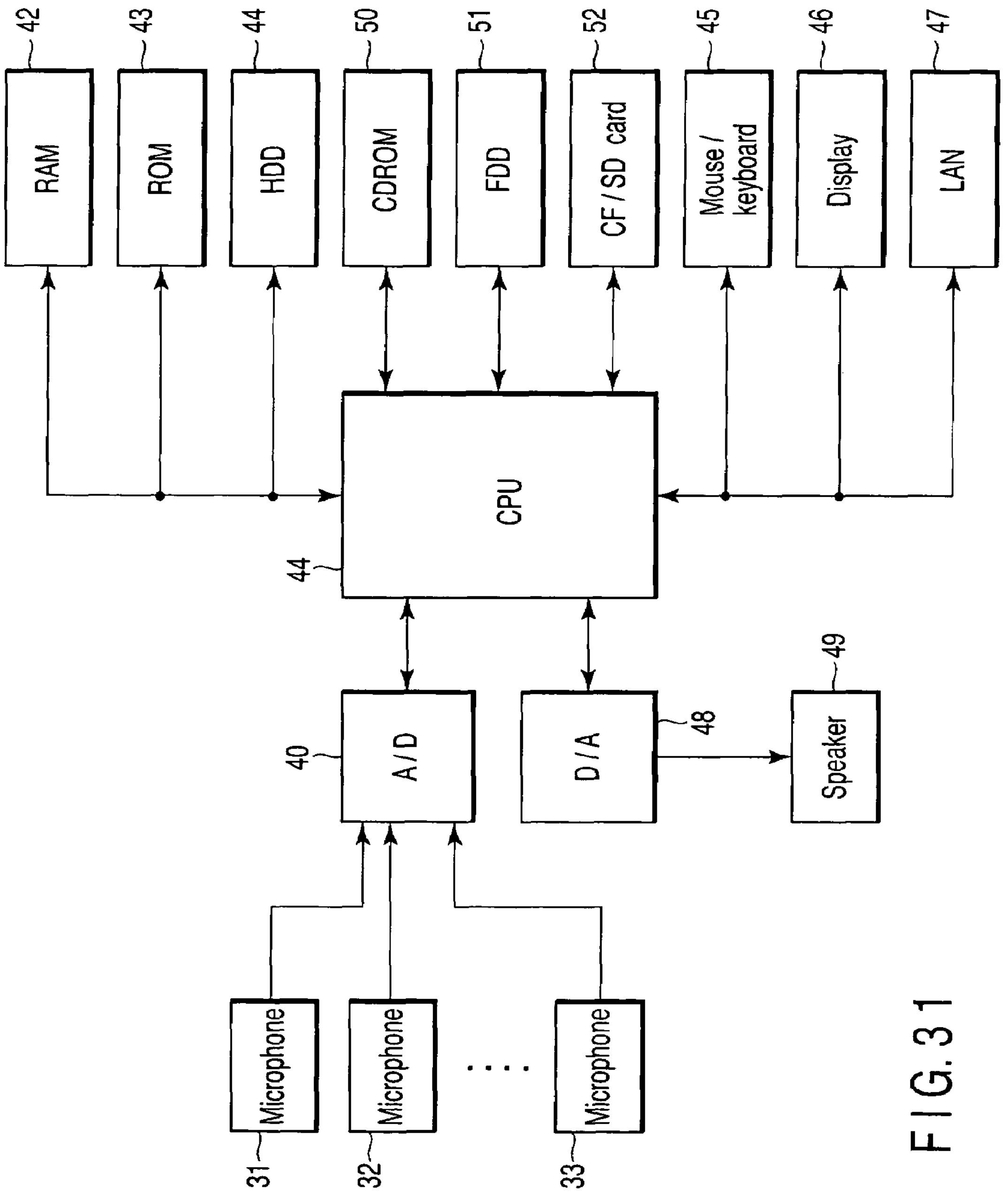
FIG. 31 is a functional block diagram according to an embodiment in which an acoustic signal processing function according to the invention is realized by a general-purpose computer.

As shown in FIG. 31, the invention can also be realized with a computer. Referring to FIG. 31, the numerals 31 to 33 designate N microphones. The numeral 40 designates analog-to-digital conversion means for inputting the N acoustic signals obtained by N microphones, and the numeral 41 designates a CPU which executes a program command for processing the N inputted acoustic signals. The numerals 42 to 47 designate typical devices which constitute a computer, such as RAM 42, ROM 43, HDD 44, a mouse/keyboard 45, a display 46, and LAN 47. The numerals 50 to 52 designate the devices which supply the program or the data to the computer from the outside through the storage medium, such as CDROM 50, FDD 51, and a CF/SD card 52. The numeral 48 designates digital-to-analog conversion means for outputting the acoustic signal, and a speaker 49 is connected to outputs of the digital-to-analog conversion means 49. The computer apparatus stores an acoustic signal processing program including the steps shown in FIG. 27 in HDD 44, and the computer apparatus reads the acoustic signal processing program in RAM 42 to perform the acoustic signal processing program with CPU 41. Therefore, the computer apparatus functions as an acoustic signal processing apparatus. Further, the computer apparatus uses the HDD 44 of the external storage device, the mouse/keyboard 45 which receives the input operation, the display 46 which is the information display means, and the speaker 49. Therefore, the computer apparatus realizes the function of the above-described user interface unit 9. The computer apparatus stores and outputs the sound source information obtained by the acoustic signal processing in and from RAM 42, ROM 43, and HDD 44, and the computer apparatus conducts communication of the sound source information through LAN 47.

[Recording Medium]

Figure 32:
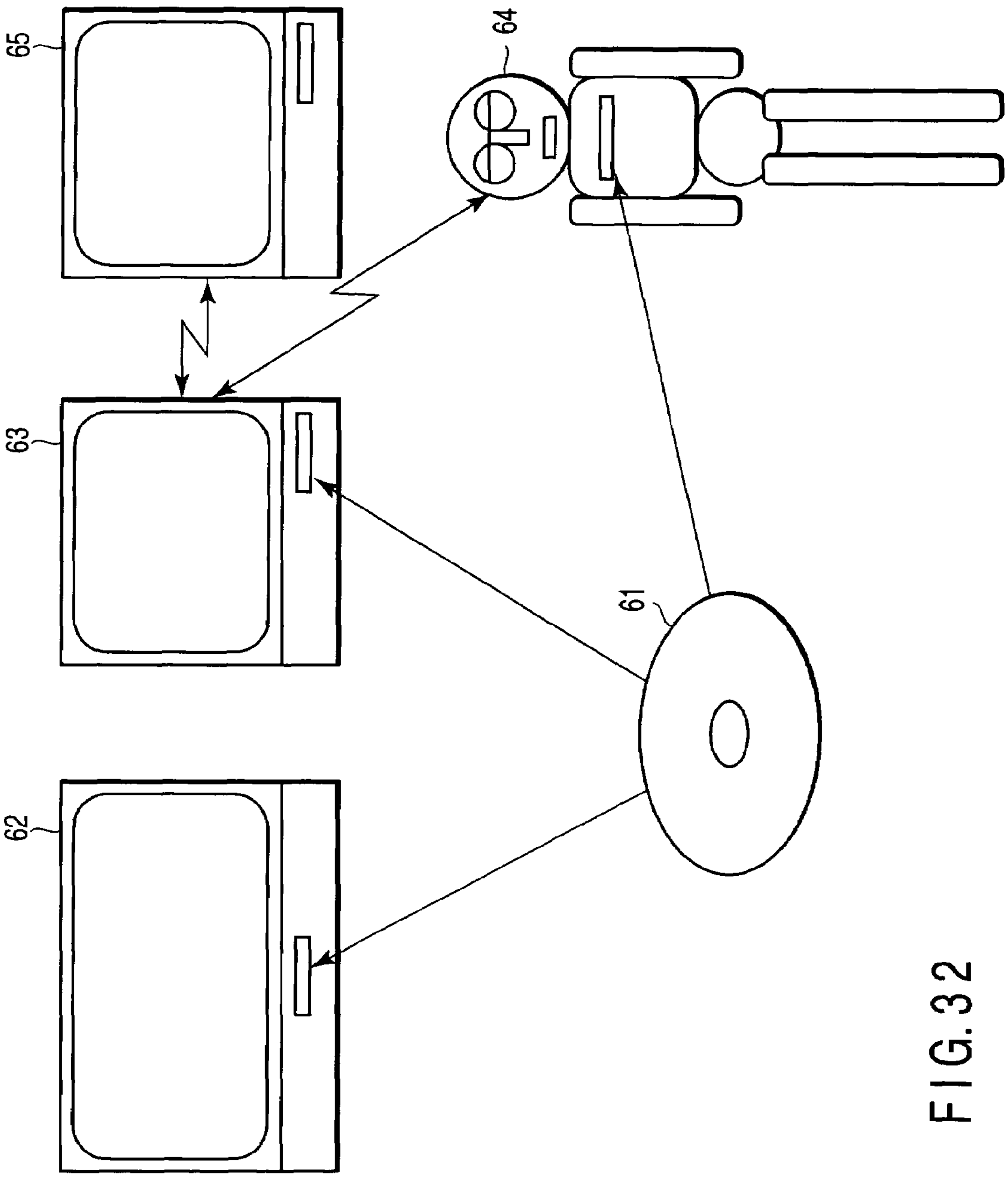
FIG. 32 is a view showing an embodiment performed by a recording medium in which a program for realizing the acoustic signal processing function according to the invention is recorded.

As shown in FIG. 32, the invention can also be realized as a computer-readable recording medium. Referring to FIG. 32, the numeral 61 designates a recording medium in which the acoustic signal processing program according to the invention is stored. The recording medium can be realized by CD-ROM, the CF/SD card, a floppy disk, and the like. The acoustic signal processing program can be executed by inserting the recording medium 61 into an electronic device 62 such as a television and the computer, an electronic device 63, and a robot 64. The acoustic signal processing program is supplied from the electronic device 63, to which the program is supplied, to another electronic device 65 or the robot 64 by communication means, which allows the program to be executed on the electronic device 65 or the robot 64.

[Acoustic Velocity Correction with Temperature Sensor]

The invention can be realized, such that the acoustic signal processing apparatus includes a temperature sensor which measures an ambient temperature and the acoustic velocity Vs shown in FIG. 22 is corrected based on the temperature data measured by the temperature sensor to determine the accurate Tmax.

Alternatively, the invention can be realized, such that the acoustic signal processing apparatus includes means for transmitting the acoustic wave and means for receiving the acoustic wave which are arranged at predetermined intervals, and the acoustic velocity Vs is directly computed and corrected to determine the accurate Tmax by measuring the time interval during which the acoustic wave emitted from the acoustic wave transmitting means reaches the acoustic wave receiving means with measurement means.

[Unequal division of θ for Equal Interval of Φ]

In the invention, when the Hough transform is performed in order to the gradient of the line group, for example, quantization is performed by dividing θ by 1°. When θ is equally divided, the value of the estimable sound source direction Φ is unequally quantized. Therefore, in the invention, it is also possible that the quantization of θ is performed by equally dividing Φ and thereby the variations in estimation accuracy are not generated in the sound source direction.

[Variation of Graphics Matching]

In the embodiment, the sound source component matching unit 315 is the means for matching the sound source stream (time series of graphics) by different pairs based on the similarity of the frequency component at the same time. The matching method enables the separation and extraction with a clue of the difference in frequency components of the sound source voices when the plural sound sources to be detected exist at the same time.

Due to the operation purpose, sometimes the sound sources to be simultaneously detected is the strongest one, or sometimes the sound sources to be simultaneously detected is one having the longest duration. Therefore, the sound source component matching unit 315 may be realized so as to include the options, in which the sound source component matching unit 315 causes the sound source streams in which the power becomes the maximum in each pair to correspond to one another, the sound source component matching unit 315 causes the sound source streams in which the duration becomes the longest to correspond to one another, and the sound source component matching unit 315 causes the sound source streams in which the overlap of the duration becomes the longest to correspond to one another. The switch of the options can be set as the parameter.

[Directivity Control of Another Sensor]

In the embodiment, the sound source the existence range estimation unit 401 determines the point having the least error as the spatial existence range of the sound source by searching for the point satisfying the least square error from the discrete points on the concentric spherical surface with the computing method 2. At this point, except for the point having the least error, the points of top k-rank, such as the point having the second least error and the point having the third least error, can be determined in terms of the least error. The acoustic signal processing apparatus can include another sensor such as a camera. In the application in which the camera is trained toward the sound source direction, while the camera is trained to the determined points of top k-rank in order of the least error, the acoustic signal processing apparatus can visually detect the object which becomes the target. Since the direction and distance of the point are determined, the angle and zoom of the camera can smoothly be controlled. Therefore, the visual sense object which should exist at the sound source position can efficiently be searched for and detected. Specifically, the apparatus can be applied to an application in which the camera is trained toward the direction of the voice to find a face.

In the method disclosed in K. Nakadai et al., “Real time active chase of person by hierarchy integration of audio-visual information,” Japan Society for Artificial Intelligence AI Challenge Kenkyuukai, SIG-Challenge-0113-5 (in Japanese), p 35-42, June 2001, the number of sound sources, directions of the sound sources, and the component estimation are determined by detecting the basic frequency component constituting the harmonic structure and the harmonic components of the basic frequency component from the frequency resolved data. Because of the assumption of the harmonic structure, this method is specialized in the human voice. However, many sound sources having no harmonic structure, such as the opening sound and closing sound of a door, exist in an actual environment, thus the method cannot deal with the source sound emitted from the sound sources having no harmonic structure.

Although the method disclosed in F. Asano, “Dividing sounds,” Transaction of the Society of Instrument and Control Engineers (in Japanese) vol. 43, No. 4, p 325-330 (2004) is not limited to the particular model, the sound source which can be dealt with by this method is limited to only one as long as the two microphones are used.

On the contrary, according to the embodiment of the invention, the phase difference in each frequency component is divided into groups in each sound source by the Hough transform. Therefore, while the two microphones are used, the function of determining the orientations of at least two sound sources and the function of separating at least two sound sources are realized. At this point, the restricted models such as the harmonic structure are not used in the invention, so that the invention can be applied to wide-ranging sound sources.

Other effects and advantages obtained by the embodiment of the invention are summarized as follows:

(1) Wide-ranging sound sources can stably be detected by using the voting method suitable to the detection of a sound source having a many frequency components or a sound source having a strong power in Hough voting.

(2) A sound source can be efficiently detected with high accuracy by considering the limitation of $\rho=0$ and the phase difference cyclicity in detecting the line.

(3) The use of the line detection result can determine useful sound source information including the spatial existence range of the sound source which is of the emitting source of the acoustic signal, the temporal existence period of the source sound emitted from the sound source, the component configuration of the source sound, the separated voice of the source sound, and the symbolic contents of the source sound.

(4) In estimating the frequency component of each sound source, the component near the line is simply selected, to which line the frequency component belongs is determined, and the coefficient is multiplied according to the distance between the line and the frequency component. Therefore, the source sound can individually be separated in a simple manner.

(5) The directivity range of the adaptive array process is adaptively set by previously learning the frequency component direction, which allows the source sounds to be separated with higher accuracy.

(6) The symbolic contents of the source sound can be determined by recognizing the source sound while separating the source sound with high accuracy.

(7) The user can confirm the operation of the apparatus, the user can perform the adjustment such that the desired operation is performed, and the user can utilize the apparatus in the adjusted state.

(8) The sound source direction is estimated from one pair of microphones, and the matching and integration of the estimation result are performed for plural pairs of microphones. Therefore, not the sound source direction, but the spatial position of the sound source can be estimated.

(9) The appropriate pair of microphones is selected from the plural pairs of microphones with respect to one sound source. Therefore, with respect to a sound source of low quality in a single pair of microphones, the sound source voice can be extracted with high quality from the voice of the pair of microphones of good reception quality, and the sound source voice can thus be recognized.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. An acoustic signal processing apparatus, comprising:

an acoustic signal input device configured to input n acoustic signals including voice from a sound source, the n acoustic signals being detected at n different points (n is a natural number equal to 3 or more);

a frequency resolution device configured to resolve each of the acoustic signals into a plurality of frequency components to obtain n pieces of frequency resolved information including phase information of each frequency component;

a two-dimensional data generating device configured to compute a phase difference between a pair of pieces of frequency resolved information in each frequency component with respect to m pairs of pieces of frequency resolved information different from each other in the n pieces of frequency resolved information (m is a natural number equal to 2 or more), the two-dimensional data generating device generating m pieces of two-dimensional data by arranging each of the frequency components as a point (x, y) on an X-Y coordinate system having an X axis as a scalar multiple of the phase difference, and a Y axis as a scalar multiple of the frequency;

a graphics detection device configured to:

(1) convert the point (x, y) into a locus on a θ-ρ coordinate system by performing a linear Hough transform ($\rho = x \cdot \cos\theta + y \cdot \sin\theta$), where θ is $-\pi < \theta \leqq \pi$ and is a gradient of a perpendicular dropped from the X axis to a line passing through an origin and the point (x, y), and where ρ is a length of the perpendicular;

(2) generate a first vote distribution S(θ, ρ) by voting a predetermined voting value to a position on which the locus passes through in a voting space having the θ-ρ coordinate system;

(3) generate a second vote distribution ($H(\theta)=S(\theta, 0)+\Sigma S(\theta, a\cdot\Delta\rho)$: $\theta \neq 0$, $H(\theta)=S(\theta, 0)$:$\theta=0$), by summing, for a same θ, a vote value S(θ, 0), and vote values S(θ, a·Δρ) at positions separated with one another by $\Delta\rho(\theta)=2(\pi\cdot\cos\theta)$: $\theta>0$, and $\Delta\rho(\theta)=-2(\pi\cdot\cos\theta)$:$\theta<0$, where θ is not equal to 0, assuming that the a·Δρ may not protrude the voting space, where a is a natural number;

(4) detect maximum positions having vote values not less than a predetermined threshold value in the second vote distribution H(θ) up to a predetermined number of high-order votes; and (5) detect a line passing through the origin in the X-Y coordinate system and having a gradient θ which is defined based on the maximum positions, for each of the m pieces of the two-dimensional data;

a sound source candidate information generating device configured to:

(a) calculate an azimuth φ between the line and the acoustic signal input device, based on the gradient θ of the line, wherein the line is a sound source candidate;

(b) estimate a frequency component for the sound source candidate based on a distance between the line and the point on the X-Y coordinate system, thereby to generate a plurality of sound source candidates including the sound source candidate in time series for each of the pairs;

(c) generate a group including a first candidate of the sound source candidates and a second candidate of the sound source candidates, thereby to acquire a duration of the group, wherein the first and second candidates are near with respect to each another within a time threshold Δt in a time axis, and wherein a difference between a first azimuth of the first candidate and the second azimuth of the second candidate is within a predetermined azimuth threshold Δφ;

(d) determine the group as a sound source stream if the duration is not lower than a predetermined threshold, thereby to provide a plurality of sound source streams including the sound source stream;

(e) calculate a degree of similarity between a first sound source stream of the streams and a second sound source stream of the streams based on estimated frequency components of the corresponding sound source candidates, wherein the first sound source stream belongs to one of the pairs and the second sound source stream belongs to another one of the pairs; and (f) associate the first sound source stream with the second sound source stream as those derived from same sound source, based on a function of the degree of similarity; and a sound source information generating device configured to generate sound source information by determining a set of associated first and second sound source streams as a sound source, determining a number of the set as a number of sound sources detected, and calculating, with respect to each of the set, a spatial existence range of the sound source based on a pair of azimuth Δφ of sound source candidates belonging to a same sound source stream at a same time.

2. The apparatus according to claim 1, wherein the frequency resolved information includes power values of the frequency components, and the predetermined voting value is a function of the power values.

3. The apparatus according to claim 1, wherein the sound source information generating device generates time series data of the frequency components, by:

selecting a sound source stream;

acquiring an intermediate value φmid from a maximum value of the azimuth φ and a minimum value of the azimuth f of a sound source candidate belonging to the sound source stream;

in-phasing two pieces of the frequency resolved information of the sound source stream so that an arrival time difference corresponding to the intermediate value φmid is canceled; and performing an adaptive array process in which center directivity is faced to front face of 0°, for the in-phased frequency resolved information.

4. The apparatus according to claim 3, wherein the sound source information generating device generates a symbol or a series of symbols that expresses at least one of linguistic meaning for the time series data of the frequency components, a kind of sound source and speaker, by analyzing and verifying the time series data.

5. An acoustic signal processing method, comprising:

inputting n acoustic signals including voice from a sound source, the n acoustic signals being captured at n different points (n is a natural number equal to 3 or more);

resolving each of the acoustic signals into a plurality of frequency components to obtain n pieces of frequency resolved information including phase information of each frequency component;

computing a phase difference between a pair of pieces of frequency resolved information in each frequency component with respect to m pairs of pieces of frequency resolved information different from each other in the n pieces of frequency resolved information (m is a natural number equal to 2 or more), and generating m pieces of two-dimensional data by arranging each of the frequency components as a point (x, y) on an X-Y coordinate system having an X axis as a scalar multiple of the phase difference, and a Y axis as a scalar multiple of the frequency;

converting the point (x, y) into a locus on a θ-ρ coordinate system by performing a linear Hough transform ($\rho=x\cdot\cos\theta+y\cdot\sin\theta$), where $\theta$ is $-\pi<\theta\leqq\pi$ and is a gradient of a perpendicular dropped from the X axis to a line passing through an origin and the point (x, y), and where $\rho$ is a length of the perpendicular;

generating a first vote distribution $S(\theta, \rho)$ by voting a predetermined voting value to a position on which the locus passes through in a voting space having the $\theta$-$\rho$ coordinate system;

generating a second vote distribution ($H(\theta)=S(\theta, 0)+\Sigma S(\theta, a\cdot\Delta\rho)$: $\theta\neq0$, $H(\theta)=S(\theta, 0)$:$\theta=0$), by summing, for a same $\theta$, a vote value $S(\theta, 0)$, and vote values $S(\theta, a\cdot\Delta\rho)$ at positions separated with one another by $\Delta\rho(\theta)=2(\pi\cdot\cos\theta)$: $\theta>0$, and $\Delta\rho(\theta)=-2(\pi\cdot\cos\theta)$: $\theta<0$, where $\theta$ is not equal to 0, assuming that the $a\cdot\Delta\rho$ may not protrude the voting space, where a is a natural number;

detecting maximum positions having vote values not less than a predetermined threshold value in the second vote distribution $H(\theta)$ up to a predetermined number of high-order votes;

detecting a line passing through the origin in the X-Y coordinate system and having a gradient $\theta$ which is defined based on the maximum positions, for each of the m pieces of the two-dimensional data;

calculating an azimuth $\phi$ between the line and the acoustic signal input device, based on the gradient $\theta$ of the line, wherein the line is a sound source candidate;

estimating a frequency component for the sound source candidate based on a distance between the line and the point on the X-Y coordinate system, thereby to generate a plurality of sound source candidates including the sound source candidate in time series for each of the pairs;

generating a group including a first candidate of the sound source candidates and a second candidate of the sound source candidates, thereby to acquire a duration of the group, wherein the first and second candidates are near with respect to each another within a time threshold $\Delta t$ in a time axis, and wherein a difference between a first azimuth of the first candidate and the second azimuth of the second candidate is within a predetermined azimuth threshold $\Delta\phi$;

determining the group as a sound source stream if the duration is not lower than a predetermined threshold, thereby to provide a plurality of sound source streams including the sound source stream;

calculating a degree of similarity between a first sound source stream of the streams and a second sound source stream of the streams based on estimated frequency components of the corresponding sound source candidates, wherein the first sound source stream belongs to one of the pairs and the second sound source stream belongs to another one of the pairs;

associating the first sound source stream with the second sound source stream as those derived from same sound source, based on a function of the degree of similarity; and generating sound source information by determining a set of associated first and second sound source streams as a sound source, determining a number of the set as a number of sound sources detected, and calculating, with respect to each of the set, a spatial existence range of the sound source based on a pair of azimuth $\Delta\phi$ of sound source candidates belonging to a same sound source stream at a same time.

6. A computer readable storage medium storing an acoustic signal processing program, which when executed by a computer, causes the computer to perform acoustic signal processing, the program comprising:

instructions for instructing a computer to input n acoustic signals including voice from a sound source, the n acoustic signals being captured at n different points (n is a natural number equal to 3 or more);

instructions for instructing the computer to resolve each of the acoustic signals into a plurality of frequency components to obtain n pieces of frequency resolved information including phase information of each frequency component;

instructions for instructing the computer to compute a phase difference between a pair of pieces of frequency resolved information in each frequency component with respect to m pairs of pieces of frequency resolved information different from each other in the n pieces of frequency resolved information (m is a natural number equal to 2 or more), and to generate device generating m pieces of two-dimensional data by arranging each of the frequency components as a point (x, y) on an X-Y coordinate system having an X axis as a scalar multiple of the phase difference, and a Y axis as a scalar multiple of the frequency;

instructions for instructing the computer to (1) convert the point (x, y) into a locus on a $\theta$-$\rho$ coordinate system by performing a linear Hough transform ($\rho=x\cdot\cos\theta+y\cdot\sin\theta$), where $\theta$ is $-\pi<\theta\leqq\pi$ and is a gradient of a perpendicular dropped from the X axis to a line passing through an origin and the point (x, y), and where $\rho$ is a length of the perpendicular;

(2) generate a first vote distribution $S(\theta, \rho)$ by voting a predetermined voting value to a position on which the locus passes through in a voting space having the $\theta$-$\rho$ coordinate system;

(3) generate a second vote distribution ($H(\theta)=S(\theta, 0)+\Sigma S(\theta, a\cdot\Delta\rho)$: $\theta\neq0$, $H(\theta)=S(\theta, 0)$:$\theta=0$), by summing, for a same $\theta$, a vote value $S(\theta, 0)$, and vote values $S(\theta, a\cdot\Delta\rho)$ at positions separated with one another by $\Delta\rho(\theta)=2(\pi\cdot\cos\theta)$: $\theta>0$, and $\Delta\rho(\theta)=-2(\pi\cdot\cos\theta)$:$\theta<0$, where $\theta$ is not equal to 0, assuming that the $a\cdot\Delta\rho$ may not protrude the voting space, where a is a natural number;

(4) detect maximum positions having vote values not less than a predetermined threshold value in the second vote distribution $H(\theta)$ up to a predetermined number of high-order votes; and (5) detect a line passing through the origin in the X-Y coordinate system and having a gradient $\theta$ which is defined based on the maximum positions, for each of the m pieces of the two-dimensional data;

instructions for instructing the computer to (a) calculate an azimuth $\phi$ between the line and the acoustic signal input device, based on the gradient $\theta$ of the line, wherein the line is a sound source candidate;

(b) estimate a frequency component for the sound source candidate based on a distance between the line and the point on the X-Y coordinate system, thereby to generate a plurality of sound source candidates including the sound source candidate in time series for each of the pairs;

(c) generate a group including a first candidate of the sound source candidates and a second candidate of the sound source candidates, thereby to acquire a duration of the group, wherein the first and second candidates are near with respect to each another within a time threshold $\Delta t$ in a time axis, and wherein a difference between a first azimuth of the first candidate and the second azimuth of the second candidate is within a predetermined azimuth threshold $\Delta\phi$;

(d) determine the group as a sound source stream if the duration is not lower than a predetermined threshold, thereby to provide a plurality of sound source streams including the sound source stream;

(e) calculate a degree of similarity between a first sound source stream of the streams and a second sound source stream of the streams based on estimated frequency components of the corresponding sound source candidates, wherein the first sound source stream belongs to one of the pairs and the second sound source stream belongs to another one of the pairs; and (f) associate the first sound source stream with the second sound source stream as those derived from same sound source, based on a function of the degree of similarity; and instructions for instructing the computer to generate sound source information by determining a set of associated first and second sound source streams as a sound source, determining a number of the set as a number of sound sources detected, and calculating, with respect to each of the set, a spatial existence range of the sound source based on a pair of azimuth $\Delta\phi$ of sound source candidates belonging to a same sound source stream at a same time.

* * * * *